(12) United States Patent
Inokuchi et al.

(10) Patent No.: US 10,991,842 B2
(45) Date of Patent: Apr. 27, 2021

(54) PHOTOELECTRIC CONVERSION ELEMENT

(71) Applicant: SUMITOMO CHEMICAL COMPANY, LIMITED, Tokyo (JP)

(72) Inventors: Daisuke Inokuchi, Osaka (JP); Sho Kanesaka, Chiba (JP); Akiko Kishida, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/758,126

(22) PCT Filed: Oct. 22, 2018

(86) PCT No.: PCT/JP2018/039204
§ 371 (c)(1),
(2) Date: Apr. 22, 2020

(87) PCT Pub. No.: WO2019/082848
PCT Pub. Date: May 2, 2019

(65) Prior Publication Data
US 2020/0287070 A1  Sep. 10, 2020

(30) Foreign Application Priority Data

Oct. 23, 2017 (JP) .............................. JP2017-204181
Jul. 17, 2018 (JP) .............................. JP2018-134384

(51) Int. Cl.
*H01L 31/10* (2006.01)
*G06K 9/00* (2006.01)
(Continued)

(52) U.S. Cl.
CPC .......... *H01L 31/10* (2013.01); *G06K 9/00013* (2013.01); *H01L 51/0007* (2013.01);
(Continued)

(58) Field of Classification Search
CPC . H01L 31/10; H01L 51/0007; H01L 51/0046; H01L 51/4253; H01L 51/442; H01L 51/42; G06K 9/00013; Y02E 10/549
See application file for complete search history.

(56) References Cited

U.S. PATENT DOCUMENTS 8,298,686 B2    10/2012  Uetani
9,180,658 B2 *  11/2015  Kanasugi ............... B41J 2/0057
(Continued)

FOREIGN PATENT DOCUMENTS

JP    2010-041022 A    2/2010
JP    2010-074127 A    4/2010
(Continued)

OTHER PUBLICATIONS

Kim et al., "Strong polymer molecular weight-dependent material interactions: impact on the formation of the polymer/fullerene bulk heterojunction morphology," Journal of Materials Chemistry A, vol. 5, No. 25, 2017, pp. 13176-13188.
(Continued)

*Primary Examiner* — Seung C Sohn
(74) *Attorney, Agent, or Firm* — Foley & Lardner LLP

(57) ABSTRACT

To reduce a dark current. In a photoelectric conversion element (10) including an anode (12), a cathode (16), and an active layer (14) provided between the anode and the cathode, the active layer contains a p-type semiconductor material that is a polymer compound having a polystyrene-equivalent weight average molecular weight of 40,000 or more and 200,000 or less, and an n-type semiconductor material. On an image obtained by binarizing an image of the active layer observed by a transmission electron microscope, the junction length between a phase of the p-type semiconductor material and a phase of the n-type semicon-
(Continued)

ductor material is 130 μm or more and less than 200 μm per square micrometer of the area of the binarized image.

8 Claims, 2 Drawing Sheets

(51) Int. Cl.
*H01L 51/00* (2006.01)
*H01L 51/42* (2006.01)
*H01L 51/44* (2006.01)

(52) U.S. Cl.
CPC ...... *H01L 51/0046* (2013.01); *H01L 51/4253* (2013.01); *H01L 51/442* (2013.01)

(56) References Cited

U.S. PATENT DOCUMENTS

| | | | |
|---|---|---|---|
| 9,362,515 | B2 | 6/2016 | Uetani et al. |
| 10,020,449 | B2 * | 7/2018 | Oshima ................ C08K 3/045 |
| 10,090,468 | B2 * | 10/2018 | Gotanda ............ H01L 51/4273 |
| 10,388,876 | B2 | 8/2019 | Yamamoto et al. |
| 2013/0333758 | A1 | 12/2013 | Okabe et al. |
| 2014/0147996 | A1 | 5/2014 | Vogt et al. |
| 2014/0239284 | A1 | 8/2014 | Yoshimura et al. |

FOREIGN PATENT DOCUMENTS

| | | |
|---|---|---|
| JP | 2011-238762 A | 11/2011 |
| JP | 2012-167242 A | 9/2012 |
| JP | 2014-189666 A | 10/2014 |
| WO | WO-2013/051676 A1 | 4/2013 |
| WO | WO-2016/059972 A1 | 4/2016 |

OTHER PUBLICATIONS

International Searching Authority, "International Search Report," issued in connection with International Patent Application No. PCT/JP2018/039204, dated Jan. 22, 2019.

International Searching Authority, "Written Opinion," issued in connection with International Patent Application No. PCT/JP2018/039204, dated Jan. 22, 2019.

* cited by examiner

PHOTOELECTRIC CONVERSION ELEMENT

CROSS-REFERENCE TO RELATED APPLICATIONS

The present application claims priority under 37 U.S.C. § 371 to International Patent Application No. PCT/JP2018/039204, filed Oct. 22, 2018, which claims priority to and the benefit of Japanese Patent Application Nos. 2017-204181, filed on Oct. 23, 2017, and 2018-134384, filed on Jul. 17, 2018. The contents of these applications are hereby incorporated by reference in their entireties.

TECHNICAL FIELD

The present invention relates to a photoelectric conversion element such as a photodetector, and a method for producing the same.

BACKGROUND ART

For example, a photoelectric conversion element is a device that is highly useful from the viewpoint of energy saving and a reduction in the emission amount of carbon dioxide, and therefore attention is attracted to the photoelectric conversion element.

The photoelectric conversion element is an element comprising at least a pair of electrodes composed of an anode and a cathode, and an active layer provided between the pair of electrodes. In a photoelectric conversion element, one of electrodes is made of a transparent or semi-transparent material, and from a side of the electrode that is transparent or semi-transparent, light enters an organic active layer. By the light energy (hv) that enters the organic active layer, charges (holes and electrons) are generated in the organic active layer, the generated holes shift toward the anode, and the electrons shift toward the cathode. The charges that have reached the anode and the cathode are extracted outside the element.

An active layer having a phase separation structure that is made by mixing an n-type semiconductor material (electron acceptor compound) and a p-type semiconductor material (electron donor compound) and comprises a phase containing the n-type semiconductor material and a phase containing the p-type semiconductor material is referred to as bulk heterojunction type active layer.

In the bulk heterojunction type active layer, the phase of the electron-acceptor compound and the phase of the electron donor compound form a phase having a fine and complicated shape that is continuous from one electrode side to the other electrode side. The phases form a complicated interface with the phases separated from each other.

For improvement of the photoelectric conversion efficiency of a photoelectric conversion element comprising the bulk heterojunction active layer, a configuration in which the area of pn junction between an n-type semiconductor and a p-type semiconductor is 100 $\mu m^2$ or more per cubic micrometer of the active layer has been known (see Patent Literature 1).

For improvement of the photoelectric conversion efficiency of a photoelectric conversion element comprising the bulk heterojunction type active layer, for example, a configuration in which on an image obtained by binarizing an image of the active layer observed by a transmission electron microscope, the junction length between an electron donor compound and an electron acceptor compound is 100 $\mu m$ or more per square micrometer of the area of the binarized image has been known (see Patent Literature 2).

RELATED ART DOCUMENTS

Patent Literature

Patent Literature 1: JP 2010-41022 A
Patent Literature 2: JP 2011-238762 A

DISCLOSURE OF INVENTION

Problem to be Solved by the Invention

For example, a photoelectric conversion element is used as a photodetector. A photoelectric conversion element that is used as a photodetector is used with a voltage applied, converts light entering the element, and detects the light as a current. However, even when light does not enter, a weak current flows through the photoelectric conversion element. This current is known as a dark current, and causes a reduction in precision of light detection. In order to further improve characteristics and performance of the photoelectric conversion element, a further reduction in dark current is required.

Means for Solving Problem

In order to solve the aforementioned problem, the present inventors have intensively studied, and as a result, found that when the weight average molecular weight of a p-type semiconductor material and the junction length between a phase of the p-type semiconductor material and a phase of an n-type semiconductor material are adjusted, the dark current of a photoelectric conversion element can be reduced. Thus, the present invention has been completed. Specifically, the present invention provides the following [1] to [9].

[1] A photoelectric conversion element comprising:
  an anode;
  a cathode; and
  an active layer provided between the anode and the cathode, wherein
  the active layer contains a p-type semiconductor material that is a polymer compound having a polystyrene-equivalent weight average molecular weight of 40,000 or more and 200,000 or less, and an n-type semiconductor material, and
  on an image obtained by binarizing an image of the active layer observed by a transmission electron microscope, a junction length between a phase of the p-type semiconductor material and a phase of the n-type semiconductor material is 130 $\mu m$ or more and less than 200 $\mu m$ per square micrometer of area of the binarized image.
[2] The photoelectric conversion element according to above [1], wherein the n-type semiconductor material is a fullerene derivative.
[3] The photoelectric conversion element according to [1] or [2], wherein the p-type semiconductor material is a polymer compound having a constitutional unit containing a thiophene skeleton.
[4] The photoelectric conversion element according to any one of above [1] to [3], wherein the photoelectric conversion element is a photodetector.
[5]. An image sensor comprising the photoelectric conversion element according to above [4].
[6] A fingerprint authentication device comprising the photoelectric conversion element according to above [4].

[7] A method for producing a photoelectric conversion element comprising an anode, a cathode, and an active layer provided between the anode and the cathode, comprising: forming the active layer comprising a step (i) of applying an ink containing a p-type semiconductor material that is a polymer compound having a polystyrene-equivalent weight average molecular weight of 40,000 or more and 200,000 or less, an n-type semiconductor material, and a solvent to an subject to be applied, to obtain a coating film, and a step (ii) of removing the solvent from the coating film, wherein on an image obtained by binarizing an image of the active layer observed by a transmission electron microscope, a junction length between the n-type semiconductor material and the p-type semiconductor material is 130 μm or more and less than 200 μm per square micrometer of area of the binarized image.

[8] The method for producing a photoelectric conversion element according to above [7], wherein the n-type semiconductor material is a fullerene derivative.

[9] The method for producing a photoelectric conversion element according to above [7] or [8], wherein the p-type semiconductor material is a polymer compound having a constitutional unit containing a thiophene skeleton.

Effect of the Invention

According to the photoelectric conversion element of the present invention, a dark current can be effectively reduced.

DESCRIPTION OF EMBODIMENTS

Figure 1:
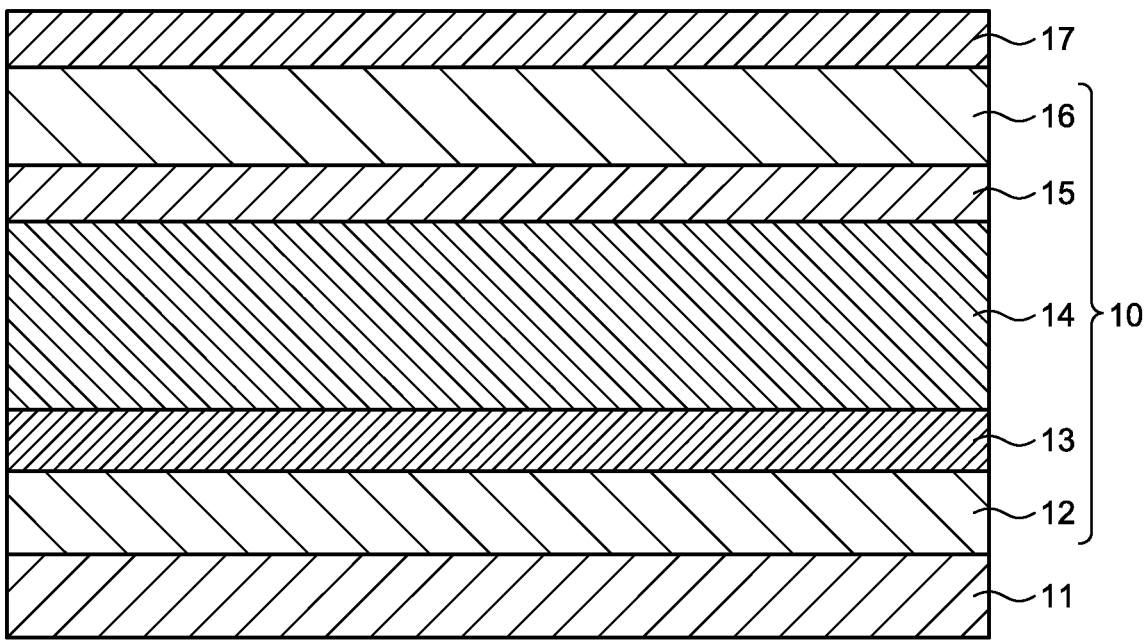
FIG. 1 is a view schematically illustrating a cut end face of a photoelectric conversion element.

Hereinafter, a photoelectric conversion element according to embodiments of the present invention will be described with reference to the drawings. The drawings only illustrate schematic shapes, sizes, and arrangements of constituent elements enough to understand the present invention. The present invention is not limited by the following description, and each constituent element can be appropriately changed without departing from the scope of the present invention. A configuration according to the embodiments of the present invention is not necessarily limited to the arrangements illustrated in the drawings during production or use.

[1. Photoelectric Conversion Element]

A photoelectric conversion element according to an embodiment is a photoelectric conversion element comprising an anode, a cathode, and an active layer provided between the anode and the cathode, wherein the active layer contains a p-type semiconductor material having a polystyrene-equivalent weight average molecular weight of 40,000 or more and 200,000 or less, and an n-type semiconductor material, and on an image obtained by binarizing an image of the active layer observed by a transmission electron microscope, the junction length between a phase of the p-type semiconductor material and a phase of the n-type semiconductor material is 130 μm or more and less than 200 μm per square micrometer of the area of the binarized image.

Herein, an acceptable configuration example of the photoelectric conversion element of the present embodiment will be described. FIG. 1 is a view schematically illustrating a cut end face of the photoelectric conversion element of the embodiment.

As illustrated in FIG. 1, a photoelectric conversion element 10 of the embodiment is provided on a supporting substrate 11, for example. The photoelectric conversion element 10 comprises an anode 12 provided in contact with the supporting substrate 11, a hole transport layer 13 provided in contact with the anode 12, an active layer 14 provided in contact with the hole transport layer 13, an electron transport layer 15 provided in contact with the active layer 14, and a cathode 16 provided in contact with the electron transport layer 15. In the configuration example, the photoelectric conversion element further comprises a sealing substrate 17 provided in contact with the cathode 16.

(Substrate)

The photoelectric conversion element is generally formed on a substrate. On this substrate, an electrode including a cathode and an anode is generally formed. A material for the substrate is not particularly limited as long as it is a material that is not chemically changed during formation of a layer containing an organic compound. Examples of the material for the substrate may include a glass, a plastic, a polymer film, and a silicone. When the substrate is an opaque substrate, it is preferable that an electrode on a side opposite to an electrode provided on a side of the opaque substrate (i.e., an electrode on a side away from the substrate) be a transparent or semi-transparent electrode.

(Electrode)

Examples of a material for the transparent or semi-transparent electrode may include a conductive metal oxide film and a semi-transparent metal thin film. Specific examples thereof may include conductive materials such as indium oxide, zinc oxide, tin oxide, and composites thereof including indium tin oxide (ITO), indium zinc oxide (IZO), and NESA, gold, platinum, silver, and copper. It is preferable that the material for the transparent or semi-transparent electrode be ITO, IZO, or tin oxide. For the electrode, a transparent conductive film formed from an organic compound such as a polyaniline or a derivative thereof or a polythiophene or a derivative thereof as a material may be used. The transparent or semi-transparent electrode may be an anode or a cathode.

When one of electrodes is transparent or semi-transparent, the other may be a low light transmitting electrode. Examples of a material for the low light transmitting electrode may include a metal and a conductive polymer. Specific examples of the material for the low light transmitting electrode may include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, alloys formed from two or more of the metals, alloys of one or more of the metals and one or more types of metals selected from the group consisting of gold, silver, platinum, copper, manganese, titanium, cobalt, nickel, tungsten, and tin, graphite, a graphite intercalation compound, a polyaniline and a derivative thereof, and a polythiophene and a derivative thereof. The alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

As a method for forming an electrode, any suitable and conventionally known formation method may be used. Examples of the method for forming an electrode may include a vacuum evaporation method, a sputtering method, an ion plating method, and a plating method.

(Active Layer)

The active layer contains a p-type semiconductor material (electron donor compound) and an n-type semiconductor material (electron acceptor compound). Details of suitable p-type semiconductor material and n-type semiconductor material will be described below. Whether a material is a p-type semiconductor material or an n-type semiconductor material can be relatively determined from HOMO and LUMO energy levels of a selected compound.

The thickness of the active layer is usually preferably 1 nm to 100 μm, more preferably 2 nm to 1,000 nm, further preferably 5 nm to 500 nm, and particularly preferably 20 nm to 200 nm. For example, when the photoelectric conversion element is a solar cell, the thickness of the active layer is preferably 500 nm to 1,000 nm. For example, when the photoelectric conversion element is a photodetector, the thickness of the active layer is preferably 500 nm to 1,000 nm.

On an image obtained by binarizing an image of the active layer observed by a transmission electron microscope, the junction length between a phase of the p-type semiconductor material and a phase of the n-type semiconductor material is 130 μm or more and less than 200 μm per square micrometer of the area of the binarized image.

A method for measuring the junction length between the phase of the p-type semiconductor material and the phase of the n-type semiconductor material may include a method in which the active layer is observed by a transmission electron microscope (TEM) and the length is measured. According to an image specific to elements contained in the p-type semiconductor material and the n-type semiconductor material, the phase of the p-type semiconductor material and the phase of the n-type semiconductor material can be observed to be separated. The image specific to the elements may include an elemental mapping image using an energy filter TEM, an energy loss image using an energy value that imparts the same contrast as that of an elemental mapping image, and an elemental mapping image obtained by energy dispersive X-ray analysis (STEM-EDX) using a scanning transmission electron microscope. An image is subjected to a binarization process in which the phase of the p-type semiconductor material is compared with the phase of the n-type semiconductor material, a bright phase is converted to white, and a dark phase is converted to black. Thus, the junction length between the phase of the p-type semiconductor material and the phase of the n-type semiconductor material can be calculated. Hereinafter, more specific description will be given.

The junction length can be calculated by a method including the following steps using computer hardware and software.

Step (i): A computer reads an obtained 20 eV loss image (TEM image) using ImageJ (image processing software).

Step (ii): The computer converts the read image to a 16-bit grayscale image using ImageJ.

Step (iii): The computer executes background correction of the converted 16-bit grayscale image under a condition of a rolling ball radius of 20 pixels.

Step (iv): The computer applies a median filter of 12 pixels to the image subjected to the background correction.

Step (v): The computer executes binarization for the image processed by the median filter using Otsu's method.

Step (vi): The computer extracts an interface on the image binarized by processing with a command of Find Edge.

Step (vii): The computer calculates the area of the interface extracted by processing with a command of Measure.

Step (viii): The computer divides the area of the obtained interface by a length of one pixel to obtain a result as "junction length."

Step (ix): The computer divides the obtained junction length by a visual field area to determine the junction length per unit area.

The junction length between the phase of the p-type semiconductor material and the phase of the n-type semiconductor material is preferably 130 μm or more and less than 200 μm, and more preferably 140 μm or more and 185 μm or less, per square micrometer of the area of the binarized image.

In the photoelectric conversion element of the present invention, the weight average molecular weight of the p-type semiconductor material in the active layer as described above is within a predetermined range, and the phase separation structure of the phase of the p-type semiconductor material and the phase of the n-type semiconductor material is a structure within a predetermined range. According to such a configuration, the specific dark current can be reduced to approximately $9 \times 10^{-4}$ A/cm$^2$ to $1 \times 10^{-6}$ A/cm$^2$. Therefore, the photoelectric conversion efficiency can be improved, noise during motion of a photodetector can be reduced, and weak light can be also sensitively detected.

(Interlayer)

As illustrated in FIG. 1, the photoelectric conversion element may include an additional interlayer such as a charge transport layer (electron transport layer, hole transport layer, electron injection layer, hole injection layer) as a further constituent element for improving properties such as photoelectric conversion efficiency.

As a material used for such an interlayer, any suitable and conventionally known material can be used. Examples of the material for the interlayer may include a halide and an oxide of alkali metal or alkaline earth metal, such as lithium fluoride.

Examples of the material used for the interlayer may include fine particles of inorganic semiconductors such as titanium oxide, and a mixture of poly(3,4-ethylenedioxythiophene) (PEDOT) and poly(4-styrene sulfonate) (PSS) (PEDOT:PSS).

As illustrated in FIG. 1, the photoelectric conversion element may include a hole transport layer between the anode and the active layer. The hole transport layer has a function of transporting holes from the active layer to the electrode.

The hole transport layer provided in contact with the anode may be especially referred to as hole injection layer. The hole transport layer (hole injection layer) provided in contact with the anode has a function of promoting injection of holes into the anode. The hole transport layer (hole injection layer) may be in contact with the active layer.

The hole transport layer contains a hole-transporting material. Examples of the hole-transporting material may include a polythiophene and a derivative thereof, an aromatic amine compound, a polymer compound containing a constitutional unit having an aromatic amine residue, CuSCN, CuI, NiO, and molybdenum oxide (MoO$_3$).

As illustrated in FIG. 1, the photoelectric conversion element may include an electron transport layer between the cathode and the active layer. The electron transport layer has a function of transporting electrons from the active layer to the cathode. The electron transport layer may be in contact with the cathode. The electron transport layer may be in contact with the active layer.

The electron transport layer contains an electron-transporting material. Examples of the electron-transporting material may include nanoparticles of zinc oxide, nanoparticles of gallium-doped zinc oxide, nanoparticles of aluminum-doped zinc oxide, polyethylenimine, polyethylenimine ethoxylated, and PFN-P2.

The interlayer can be formed by a coating method that is the same as that in the method for producing an active layer as described above.

(Sealing Layer)

The photoelectric conversion element may include a sealing layer. For example, the sealing layer can be provided on a side of an electrode away from the substrate. The sealing layer may be formed from a material having properties of blocking a moisture content (water vapor barrier properties) or blocking oxygen (oxygen barrier properties).

(Use of Photoelectric Conversion Element)

Under irradiation with light, the photoelectric conversion element of the embodiment can generate a photovoltaic power between electrodes, and act as a solar cell. A plurality of solar cells that are integrated can be used as a thin film solar cell module.

When the photoelectric conversion element of the embodiment is irradiated with light from a side of a transparent or semi-transparent electrode with a voltage applied between electrodes, a photocurrent flows, and the photoelectric conversion element can act as a photodetector (photosensor). A plurality of photosensors that are integrated can be also used as an image sensor.

(Use Example of Photoelectric Conversion Element)

The photoelectric conversion element according to the embodiment of the present invention as described above can be suitably used for a detection portion provided in various electronic devices such as a workstation, a personal computer, a portable information terminal, an access management system, a digital camera, and a medical device.

The photoelectric conversion element (photodetector) of the present invention can be suitably used, for example, for an image detection portion (image sensor) for a solid imaging device such as an X-ray imaging device or a CMOS image sensor, a detection portion of detecting given characteristics of a part of a living body such as a fingerprint detection portion, a face detection portion, a vein detection portion, or an iris detection portion, or a detection portion of an optical biosensor such as a pulse oximeter, which is provided in the electronic device exemplified above.

Hereinafter, configuration examples of the image detection portion for a solid imaging device and a fingerprint detection portion for a biometric authorization device (fingerprint authentication device) among the detection portions for which the photoelectric conversion element according to the embodiment of the present invention can be suitably used will be described with reference to the drawings.

(Image Detection Portion)

Figure 2:
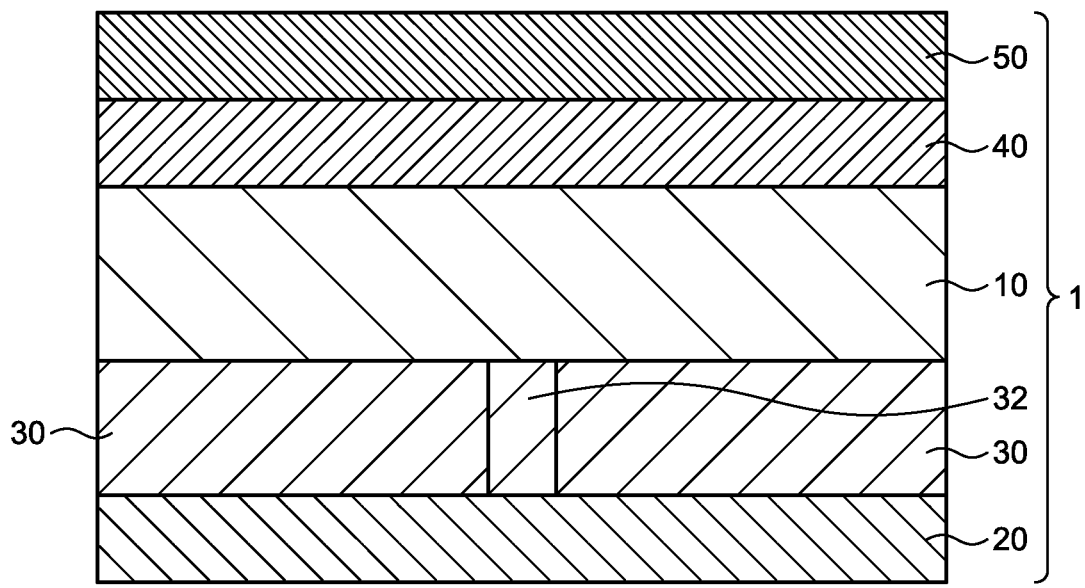
FIG. 2 is a view schematically illustrating a configuration example of an image detection portion.

FIG. 2 is a view schematically illustrating the configuration example of the image detection portion for a solid imaging device.

An image device portion 1 includes a CMOS transistor substrate 20, an interlayer insulating layer 30 provided so as to cover the CMOS transistor substrate 20, the photoelectric conversion element 10 according to the embodiment of the present invention that is provided on the interlayer insulating layer 30, an interlayer wiring portion 32 that is provided so as to pass through the interlayer insulating layer 30 and electrically connects the CMOS transistor substrate 20 to the photoelectric conversion element 10, a sealing layer 40 provided so as to cover the photoelectric conversion element 10, and a color filter 50 provided on the sealing layer 40.

The CMOS transistor substrate 20 has any suitable and conventionally known configuration in an aspect corresponding to a design.

The CMOS transistor substrate 20 includes a function element such as a CMOS transistor circuit (MOS transistor circuit) for achieving various functions, including a transistor, a capacitor, or the like that is formed within the thickness of the substrate.

Examples of the function element may include floating diffusion, a reset transistor, an output transistor, and a selection transistor.

In the CMOS transistor substrate 20, a signal reading circuit or the like is formed using such a function element, a wiring, and the like.

The interlayer insulating layer 30 can be made from any suitable and conventionally known insulating material such as silicon oxide or an insulating resin. For example, the interlayer wiring portion 32 can be made from any suitable and conventionally known conductive material (wiring material) such as copper or tungsten. For example, the interlayer wiring portion 32 may be a wiring inside a hole that is formed at the same time as formation of a wiring layer, or a buried plug formed separately from the wiring layer.

The sealing layer 40 can be made from any suitable and conventionally known material as long as penetration of harmful substance that may functionally deteriorate the photoelectric conversion element 10, such as oxygen or water, can be prevented or suppressed. The sealing layer 40 may be the sealing substrate 17 described above.

As the color filter 50, for example, a primary color filter that is made from any suitable and conventionally known material and corresponds to a design of the image device portion 1 can be used. As the color filter 50, a complementary color filter having a thickness smaller than that of the primary color filter can be used. As the complementary color filter, for example, a color filter in which three types of colors (yellow, cyan, magenta), (yellow, cyan, transparent), (yellow, transparent, magenta), or (transparent, cyan, magenta) are combined can be used. These color filters can be optionally and suitably arranged so as to correspond to a design of the photoelectric conversion element 10 and the CMOS transistor substrate 20 as long as a color image data can be produced.

Light received by the photoelectric conversion element 10 through the color filter 50 is converted to an electrical signal corresponding to the amount of light received by the photoelectric conversion element 10, and sent through the electrode outside the photoelectric conversion element 10 as a received signal, that is, an electrical signal corresponding to an imaging subject.

The received signal sent from the photoelectric conversion element 10 is then put through the interlayer wiring portion 32 into the CMOS transistor substrate 20, read by the signal reading circuit formed in the CMOS transistor substrate 20, and processed by any further, suitable, and conventionally known function portion that is not illustrated. Thus, an image data based on the imaging subject is produced.

(Fingerprint Detection Portion)

Figure 3:
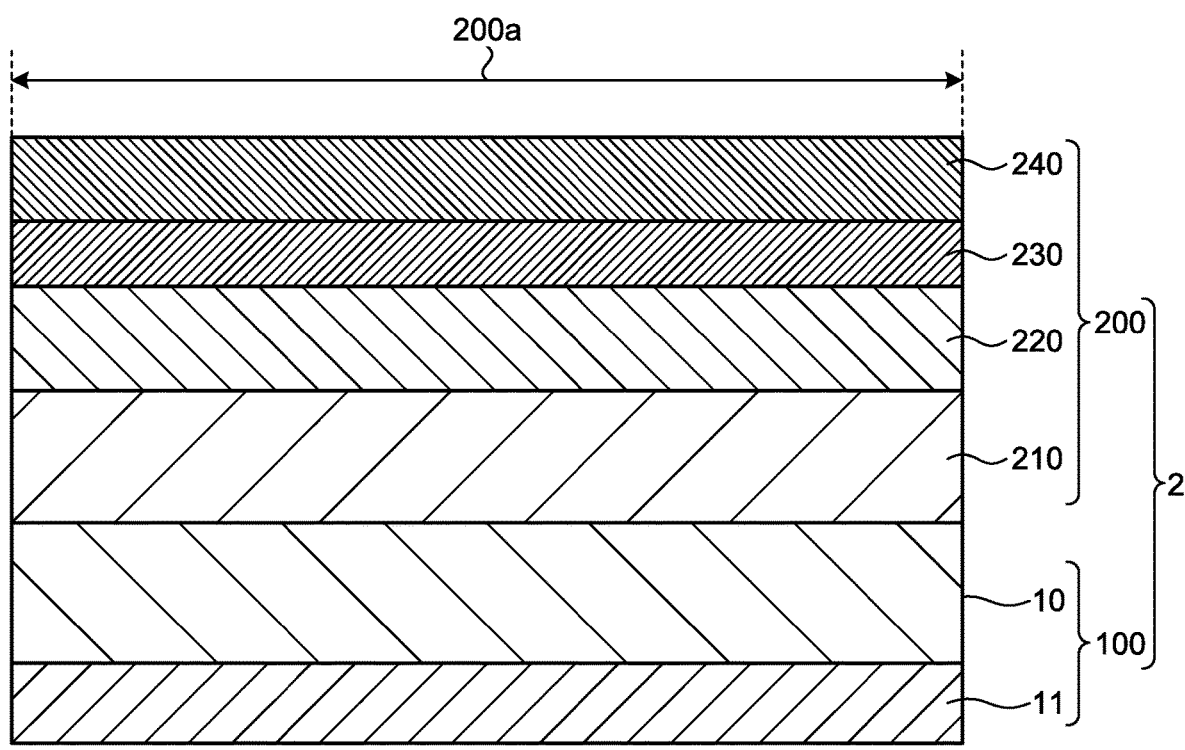
FIG. 3 is a view schematically illustrating a configuration example of a fingerprint detection portion.

FIG. 3 is a view schematically illustrating the configuration example of the fingerprint detection portion.

A display device 2 of a portable information terminal includes a fingerprint detection portion 100 including the photoelectric conversion element 10 according to the embodiment of the present invention as a main constituent element, and a display panel portion 200 that is provided on the fingerprint detection portion 100 and displays a predetermined image.

In this configuration example, the fingerprint detection portion 100 is provided at a region that substantially matches a display region 200a of the display panel portion 200. That is, the display panel portion 200 is integrally layered on the fingerprint detection portion 100.

When fingerprint detection is performed for only a part of the display region 200a, the fingerprint detection portion 100 may be provided so as to correspond to only the part of the display region.

The fingerprint detection portion 100 includes the photoelectric conversion element 10 according to the embodiment of the present invention as a function portion that performs an essential function. The fingerprint detection element 100 may include any suitable and conventionally known member such as a protection film, a supporting substrate, a sealing substrate, a sealing member, a barrier film, a band-pass filter, or an infrared radiation-cutting filter, in an aspect corresponding to such a design that desired characteristics are obtained. For the fingerprint detection portion 100, a configuration of the image detection portion described can be utilized.

The photoelectric conversion element 10 may be included as any embodiment in the display region 200a. For example, a plurality of photoelectric conversion elements 10 may be arranged in a matrix.

As described above, the photoelectric conversion element 10 is provided on the supporting substrate 11 or a sealing substrate, and an electrode (anode or cathode) is provided on the supporting substrate 11, for example, in a matrix.

Light received by the photoelectric conversion element 10 is converted to an electrical signal corresponding to the amount of light received by the photoelectric conversion element 10, and sent through the electrode outside the photoelectric conversion element 10 as a received signal, that is, an electrical signal corresponding to an imaged fingerprint.

In this configuration example, the display panel portion 200 is configured as an organic electroluminescent display panel (organic EL display panel) including a touch sensor panel. The display panel portion 200 may be configured, for example, as a display panel having any suitable and conventionally known configuration such as a liquid-crystal display panel including a light source such as a backlight, instead of the organic EL display panel.

The display panel portion 200 is provided on the fingerprint detection portion 100 described above. The display panel portion 200 includes an organic electroluminescent element (organic EL element) 220 as a function portion that performs an essential function. The display panel portion 200 may further include any suitable and conventionally known substrate such as a glass substrate (a supporting substrate 210 or a sealing substrate 240), and any suitable and conventionally known member such as a sealing member, a barrier film, a polarizing plate such as a circularly polarizing plate, or a touch sensor panel 230, in an embodiment corresponding to desired characteristics.

In the configuration example described above, the organic EL element 220 is used as a light source of a pixel in the display region 200a, and further used as a light source for imaging a fingerprint in the fingerprint detection portion 100.

Herein, a motion of the fingerprint detection portion 100 will be simply described.

During execution of fingerprint authentication, the fingerprint detection portion 100 detects a fingerprint using light emitted from the organic EL element 220 of the display panel portion 200. Specifically, light emitted from the organic EL element 220 is sent through a constituent element provided between the organic EL element 220 and the photoelectric conversion element 10 of the fingerprint detection portion 100, and reflected from the skin of the fingertip (the surface of the finger) disposed in contact with the surface of the display panel portion 200 within the display region 200a. At least a part of the light reflected from the surface of the finger is sent through the constituent element provided, received by the photoelectric conversion element 10, and converted to an electrical signal corresponding to the amount of light received of the photoelectric conversion element 10. From the converted electrical signal, image information about the fingerprint of the surface of the finger is made.

The portable information terminal including the display device 2 compares the obtained image information with fingerprint data for fingerprint authentication recorded in advance and executes fingerprint authentication at any suitable and conventionally known steps.

[2. Method for Producing Photoelectric Conversion Element]

A method for producing the photoelectric conversion element of the embodiment is not particularly limited. The photoelectric conversion element can be produced by a formation method suitable for a material selected for formation of each constituent element.

Since the active layer that is a main constituent element provided in the photoelectric conversion element of the embodiment is a bulk heterojunction type, the active layer can be produced by a coating method using an ink.

The method for producing a photoelectric conversion element is a method for producing a photoelectric conversion element comprising an anode, a cathode, and an active layer provided between the anode and the cathode, wherein the step of forming the active layer comprises a step (i) of applying an ink containing a p-type semiconductor material that is a polymer compound having a polystyrene-equivalent weight average molecular weight of 40,000 or more and 200,000 or less, an n-type semiconductor material, and a solvent to a subject to be applied, to obtain a coating film, and a step (ii) of removing the solvent from the coating film, wherein on an image obtained by binarizing an image of the active layer observed by a transmission electron microscope, a junction length between the n-type semiconductor material and the p-type semiconductor material is 130 μm or more and less than 200 μm per square micrometer of area of the binarized image.

Hereinafter, the steps (i) and (ii) included in the step of forming the active layer that is a main constituent element in the photoelectric conversion element of the present invention will be described.

(Step (i))

As a method for applying an ink to a subject to be applied, any suitable coating method can be used. The coating method is preferably a slit coating method, a knife coating method, a spin coating method, a microgravure-coating method, a gravure-coating method, a bar-coating method, an ink-jet printing method, a nozzle coating method, or a capillary coating method, more preferably a slit coating method, a spin coating method, a capillary coating method, or a bar-coating method, and further preferably a slit coating method or a spin coating method.

An ink for formation of the active layer is applied to a subject to be applied according to the photoelectric conversion element and the method for producing the same. The ink for formation of the active layer may be applied to a functional layer that is in the photoelectric conversion element and can form the active layer in a step of producing the photoelectric conversion element. Therefore, the subject coated with the ink for formation of the active layer varies depending on a layer structure of the photoelectric conversion element to be produced and an order of layer formation. For example, when the photoelectric conversion element has a layer structure of substrate/anode/hole transport layer/active layer/electron transport layer/cathode and a layer described on a more left side is formed early, the subject coated with the ink is a hole transport layer. For example, when the photoelectric conversion element has a layer structure of substrate/cathode/electron transport layer/active layer/hole transport layer/anode and a layer described on a more left side is formed early, the subject coated with the ink is an electron transport layer.

(Step (ii))

As a method for removing the solvent from the coating film of the ink, that is, a method for removing the solvent from the coating film to form a solidified film, any suitable method can be used. Examples of the method for removing the solvent may include drying methods such as a method that directly heating the solvent on a hot plate, a hot air drying method, a drying method by infrared radiation heating, a drying method by flash lamp annealing, and a drying method under reduced pressure.

In addition to the steps (i) and (ii), the step of forming the active layer may include another step without impairing the object and effects of the present invention.

The method for producing a photoelectric conversion element may be a method for producing a photoelectric conversion element including a plurality of active layers or a method in which the steps (i) and (ii) are repeated a plurality of times.

(Ink)

The ink may be a solution or a dispersion liquid such as a dispersion liquid, an emulsion (emulsion liquid), or a suspension (suspension liquid). The ink of the embodiment is an ink for formation of the active layer, contains the p-type semiconductor material, the n-type semiconductor material, and a first solvent, and may desirably contain a second solvent. Hereinafter, a component for the ink will be described.

Herein, terms used commonly in the following description will be firstly described.

A "polymer compound" means a polymer that has a molecular weight distribution and a polystyrene-equivalent number average molecular weight of $1 \times 10^3$ or more and $1 \times 10^8$ or less. A constitutional unit included in the polymer compound is in total 100% by mole.

A "constitutional unit" means a unit of which the number present in the polymer compound is one or more.

A "hydrogen atom" may be a light hydrogen atom or a heavy hydrogen atom.

A "halogen atom" includes a fluorine atom, a chlorine atom, a bromine atom, and an iodine atom.

"Optionally having a substituent" includes both embodiments where all hydrogen atoms constituting a compound or group are unsubstituted and a part or all of one or more hydrogen atoms are substituted with a substituent.

An "alkyl group" may be linear, branched, or cyclic unless otherwise specified. The number of carbon atoms of a linear alkyl group is usually 1 to 50, preferably 1 to 30, and more preferably 1 to 20, not including the number of carbon atoms of a substituent. The number of carbon atoms of a branched or cyclic alkyl group is usually 3 to 50, preferably 3 to 30, and more preferably 4 to 20, not including the number of carbon atoms of a substituent.

The alkyl group may have a substituent. Specific examples of the alkyl group may include a methyl group, an ethyl group, an n-propyl group, an isopropyl group, an n-butyl group, an isobutyl group, a tert-butyl group, an n-pentyl group, an isoamyl group, a 2-ethylbutyl group, an n-hexyl group, a cyclohexyl group, an n-heptyl group, a cyclohexylmethyl group, a cyclohexylethyl group, an n-octyl group, a 2-ethylhexyl group, a 3-n-propylheptyl group, an adamantyl group, an n-decyl group, a 3,7-dimethyloctyl group, a 2-ethyloctyl group, a 2-n-hexyl-decyl group, an n-dodecyl group, a tetradecyl group, a hexadecyl group, an octadecyl group, and an eicosyl group. Specific examples of an alkyl group having a substituent may include a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-n-hexylphenyl)propyl group, and a 6-ethyloxyhexyl group.

An "aryl group" means an atomic group derived by removal of a hydrogen atom directly bonded to a carbon atom constituting a ring from an aromatic hydrocarbon optionally having a substituent.

The aryl group may have a substituent. Specific examples of the aryl group may include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups in which the groups have a substituent such as an alkyl group, an alkoxy group, an aryl group, or a fluorine atom.

An "alkoxy group" may be linear, branched, or cyclic. The number of carbon atoms of a linear alkoxy group is usually 1 to 40, and preferably 1 to 10, not including the number of carbon atoms of a substituent. The number of carbon atoms of a branched or cyclic alkoxy group is usually 3 to 40, and preferably 4 to 10, not including the number of carbon atoms of a substituent.

The alkoxy group may have a substituent. Specific examples of the alkoxy group may include a methoxy group, an ethoxy group, an n-propyloxy group, an isopropyloxy group, an n-butyloxy group, an isobutyloxy group, a tert-butyloxy group, an n-pentyloxy group, an n-hexyloxy group, a cyclohexyloxy group, an n-heptyloxy group, an n-octyloxy group, a 2-ethylhexyloxy group, an n-nonyloxy group, an n-decyloxy group, a 3,7-dimethyloctyloxy group, and a lauryloxy group.

The number of carbon atoms of an "aryloxy group" is usually 6 to 60, and preferably 6 to 48, not including the number of carbon atoms of a substituent.

The aryloxy group may have a substituent. Specific examples of the aryloxy group may include a phenoxy group, a 1-naphthyloxy group, a 2-naphthyloxy group, a 1-anthracenyloxy group, a 9-anthracenyloxy group, a 1-pyrenyloxy group, and groups in which the groups have a substituent such as an alkyl group, an alkoxy group, or a fluorine atom.

An "alkylthio group" may be linear, branched, or cyclic. The number of carbon atoms of a linear alkylthio group is usually 1 to 40, and preferably 1 to 10, not including the number of carbon atoms of a substituent. The number of carbon atoms of a branched or cyclic alkylthio group is usually 3 to 40, and preferably 4 to 10, not including the number of carbon atoms of a substituent.

The alkylthio group may have a substituent. Specific examples of the alkylthio group may include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, and a trifluoromethylthio group.

The number of carbon atoms of an "arylthio group" is usually 6 to 60, and preferably 6 to 48, not including the number of carbon atoms of a substituent.

The arylthio group may have a substituent. Examples of the arylthio group may include a phenylthio group, a C1-C12 alkyloxyphenylthio group ("C1-C12" means that the number of carbon atoms of a group described after that is 1 to 12. Hereinafter as the same), a C1-C12 alkylphenylthio group, a 1-naphthylthio group, a 2-naphthylthio group, and a pentafluorophenylthio group.

A "p-valent heterocyclic group" (p is an integer of 1 or more) means an atomic group derived by removal of p hydrogen atoms among hydrogen atoms directly bonded to a carbon atom or a heteroatom constituting a ring from a heterocyclic compound optionally having a substituent. Among p-valent heterocyclic groups, a "p-valent aromatic heterocyclic group" is preferred. The "p-valent aromatic heterocyclic group" means an atomic group derived by removal of p hydrogen atoms among hydrogen atoms directly bonded to a carbon atom or a heteroatom constituting a ring from an aromatic heterocyclic compound optionally having a substituent.

Examples of a substituent may be in a heterocyclic compound may include a halogen atom, an alkyl group, an aryl group, an alkoxy group, an aryloxy group, an alkylthio group, an arylthio group, a monovalent heterocyclic group, a substituted amino group, an acyl group, an imine residue, an amido group, an acid imido group, a substituted oxycarbonyl group, an alkenyl group, an alkynyl group, a cyano group, and a nitro group.

The aromatic heterocyclic compound includes a compound in which an aromatic ring is fused with a heterocycle not exhibiting aromaticity in addition to a compound in which a heterocycle by itself exhibits aromaticity.

Specific examples of the compound in which a heterocycle exhibits aromaticity by itself among aromatic heterocyclic compounds may include oxadiazole, thiadiazole, thiazole, oxazole, thiophene, pyrrole, phosphol, furan, pyridine, pyrazine, pyrimidine, triazine, pyridazine, quinoline, isoquinoline, carbazole, and dibenzophosphol.

Specific examples of the compound in which an aromatic ring is fused with a heterocycle not exhibiting aromaticity among aromatic heterocyclic compounds may include phenoxazine, phenothiazine, dibenzoborole, dibenzosilole, and benzopyran.

The number of carbon atoms of a "monovalent heterocyclic group" is usually 2 to 60, and preferably 4 to 20, not including the number of carbon atoms of a substituent.

The monovalent heterocyclic group may have a substituent, and specific examples of the monovalent heterocyclic group may include a thienyl group, a pyrrolyl group, a furyl group, a pyridyl group, a piperidyl group, a quinolyl group, an isoquinolyl group, a pyrimidinyl group, a triazinyl group, and groups in which the groups have a substituent such as an alkyl group or an alkoxy group.

A "substituted amino group" means an amino group having a substituent. Examples of a substituent that may be in the substituted amino group may include an alkyl group, an aryl group, and a monovalent heterocyclic group. It is preferable that the substituent be an alkyl group, an aryl group, or a monovalent heterocyclic group. The number of carbon atoms of the substituted amino group is usually 2 to 30.

Examples of the substituted amino group may include dialkylamino groups such as a dimethylamino group and a diethylamino group, and diarylamino groups such as a diphenylamino group, a bis(4-methylphenyl)amino group, a bis(4-tert-butylphenyl)amino group, and a bis(3,5-di-tert-butylphenyl)amino group.

The number of carbon atoms of an "acyl group" is usually about 2 to 20, and preferably 2 to 18. Specific examples of the acyl group may include an acetyl group, a propionyl group, a butyryl group, an isobutyryl group, a pivaloyl group, a benzoyl group, a trifluoroacetyl group, and a pentafluorobenzoyl group.

An "imine residue" means an atomic group derived by removal of a hydrogen atom directly bonded to a carbon atom or a nitrogen atom constituting a carbon atom-nitrogen atom double bond from an imine compound. The "imine compound" means an organic compound having a carbon atom-nitrogen atom double bond in the molecule. Examples of the imine compound may include an aldimine, a ketimine, and a compound in which a hydrogen atom bonded to a nitrogen atom constituting a carbon atom-nitrogen atom double bond in an aldimine is substituted with an alkyl group or the like.

The number of carbon atoms of the imine residue is usually about 2 to 20, and preferably 2 to 18. Examples of the imine residue may include groups represented by the following structural formulae.

[Chemical Formula 1]

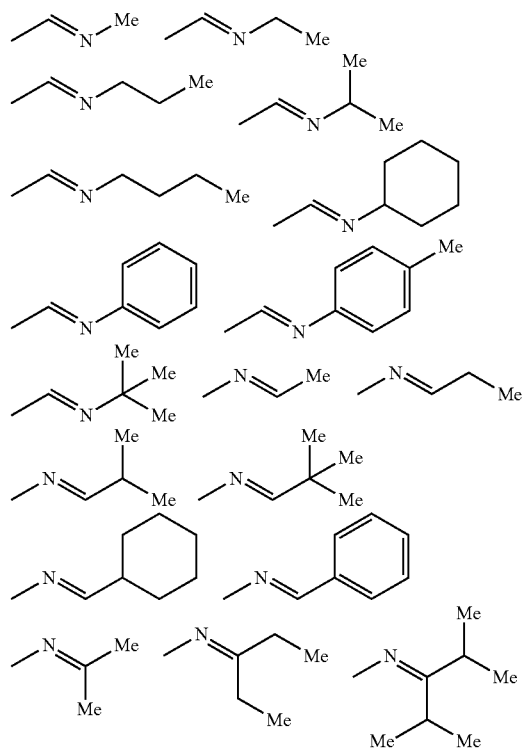

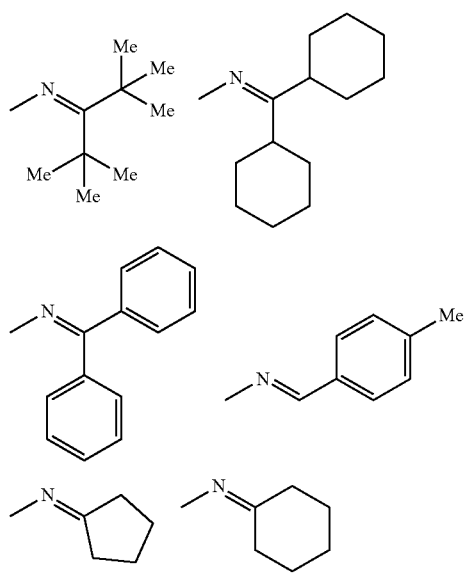

An "amido group" means an atomic group derived by removal of a hydrogen atom bonded to a nitrogen atom from an amide. The number of carbon atoms of the amido group is usually 1 to 20, and preferably 1 to 18. Specific examples of the amido group may include a formamido group, an acetamido group, a propioamido group, a butyramido group, a benzamido group, a trifluoroacetamido group, a pentafluorobenzamido group, a diformamido group, a diacetamido group, a dipropioamido group, a dibutyramido group, a dibenzamido group, a ditrifuloroacetamido group, and a dipentafluorobenzamido group.

An "acid imido group" means an atomic group derived by removal of a hydrogen atom bonded to a nitrogen atom from an acid imide. The number of carbon atoms of the acid imido group is usually 4 to 20. Specific examples of the acid imido group may include groups represented by the following structural formulae.

[Chemical Formula 2]

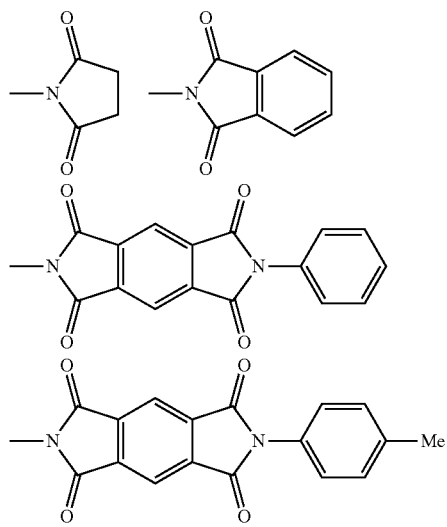

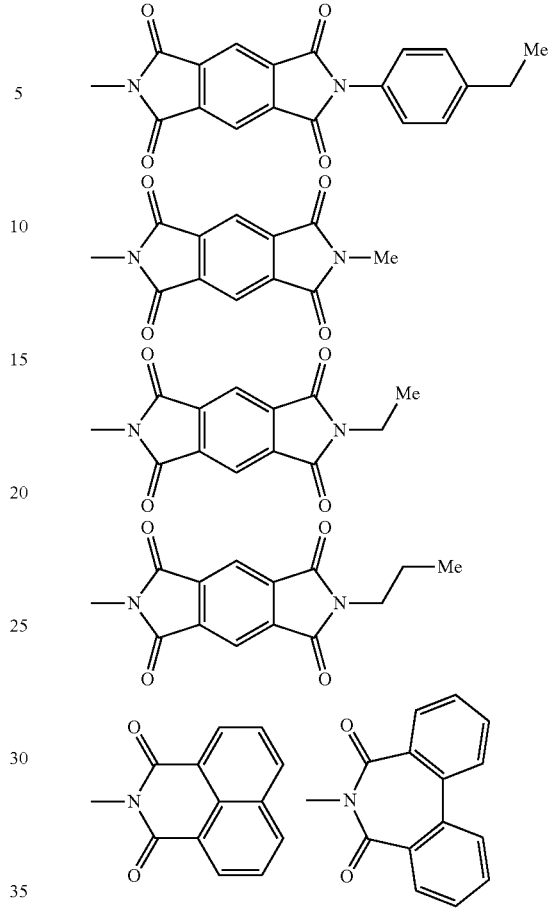

A "substituted oxycarbonyl group" means a group represented by R'—O—(C=O)—. Herein, R' is an alkyl group, an aryl group, an arylalkyl group, or a monovalent heterocyclic group.

The number of carbon atoms of the substituted oxycarbonyl group is usually about 2 to 60, and preferably 2 to 48.

Specific examples of the substituted oxycarbonyl group may include a methoxycarbonyl group, an ethoxycarbonyl group, a propoxycarbonyl group, an isopropoxycarbonyl group, a butoxycarbonyl group, an isobutoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

An "alkenyl group" may be linear, branched, or cyclic. The number of carbon atoms of a linear alkenyl group is usually 2 to 30, and preferably 3 to 20, not including the number of carbon atoms of a substituent. The number of carbon atoms of a branched or cyclic alkenyl group is usually 3 to 30, and preferably 4 to 20, not including the number of carbon atoms of a substituent.

The alkenyl group may have a substituent. Specific examples of the alkenyl group may include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and groups in which the groups have a substituent such as an alkyl group or an alkoxy group.

An "alkynyl group" may be linear, branched, or cyclic. The number of carbon atoms of a linear alkenyl group is usually 2 to 20, and preferably 3 to 20, not including the number of carbon atoms of a substituent. The number of carbon atoms of a branched or cyclic alkenyl group is usually 4 to 30, and preferably 4 to 20, not including the number of carbon atoms of a substituent.

The alkynyl group may have a substituent. Specific examples of the alkynyl group may include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and groups in which the groups have a substituent such as an alkyl group or an alkoxy group.

(P-Type Semiconductor Material)

The p-type semiconductor material of the photoelectric conversion element of the embodiment is a polymer compound having a predetermined polystyrene-equivalent weight average molecular weight.

Herein, the polystyrene-equivalent weight average molecular weight means a weight average molecular weight calculated by gel permeation chromatography (GPC) using a standard sample of polystyrene.

Especially from the viewpoint of reducing a dark current, the polystyrene-equivalent weight average molecular weight of the p-type semiconductor material is preferably 40,000 or more and 200,000 or less, and more preferably 40,000 or more and 150,000 or less. Especially from the viewpoint of improving the solubility in a solvent, it is further preferably 45,000 or more and 150,000 or less.

Examples of the p-type semiconductor material that is a polymer compound may include a polyvinyl carbazole and a derivative thereof, a polysilane and a derivative thereof, a polysiloxane having an aromatic amine structure in a side chain or a main chain, a polyaniline and a derivative thereof, a polythiophene and a derivative thereof, a polypyrrole and a derivative thereof, a polyphenylenevinylene and a derivative thereof, a polythienylenevinylene and a derivative thereof, and a polyfluorene and a derivative thereof.

It is preferable that the p-type semiconductor material is a polymer compound having a constitutional unit represented by the following formula (I) and/or a constitutional unit represented by the following formula (II).

[Chemical formula 3]

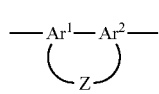 (I)

In formula (I), $Ar^1$ and $Ar^2$ are a trivalent aromatic heterocyclic group, and Z is each of groups represented by the following formulae (Z-1) to (Z-7).

[Chemical formula 4]

 (II)

In formula (II), $Ar^3$ is a divalent aromatic heterocyclic group.

[Chemical formula 5]

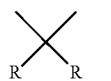 (Z-1)

 (Z-2)

 (Z-3)

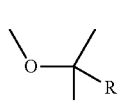 (Z-4)

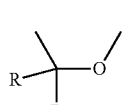 (Z-5)

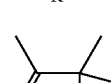 (Z-6)

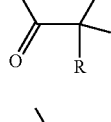 (Z-7)

In formulae (Z-1) to (Z-7), R is a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amido group, an acid imido group, a substituted oxycarbonyl group, an alkenyl group, an alkynyl group, a cyano group, or a nitro group. When each of Formulae (Z-1) to (Z-7) has two Rs, the two Rs may be the same as or different from each other.

It is preferable that the constitutional unit represented by Formula (I) is a constitutional unit represented by the following formula (I-1).

[Chemical formula 6]

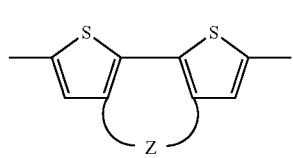 (I-1)

In formula (I-1), Z has the same meaning as described above.

Examples of the constitutional unit represented by formula (I-1) may include constitutional units represented by the following formulae (501) to (505).

[Chemical formula 7]

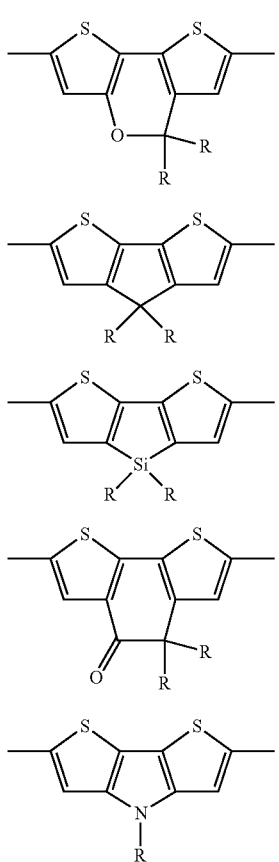

(501)
(502)
(503)
(504)
(505)

In formulae (501) to (505), R has the same meaning as described above. When there are two Rs, the two Rs may be the same as or different from each other.

The number of carbon atoms of the divalent aromatic heterocyclic group represented by $Ar^3$ is usually 2 to 60, preferably 4 to 60, and more preferably 4 to 20. The divalent aromatic heterocyclic group represented by $Ar^3$ optionally has a substituent. Examples of the substituent that may be in the divalent aromatic heterocyclic group represented by $Ar^3$ may include a halogen atom, an alkyl group, an aryl group, an alkoxy group, an aryloxy group, an alkylthio group, an arylthio group, a monovalent heterocyclic group, a substituted amino group, an acyl group, an imine residue, an amido group, an acid imido group, a substituted oxycarbonyl group, an alkenyl group, an alkynyl group, a cyano group, and a nitro group.

Examples of the divalent aromatic heterocyclic group represented by $Ar^3$ may include groups represented by the following Formulae (101) to (185).

[Chemical formula 8]

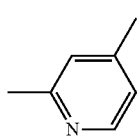

(101)

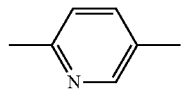

(102)

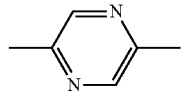

(103)

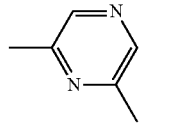

(104)

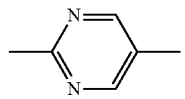

(105)

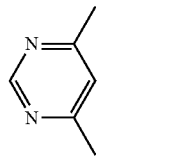

(106)

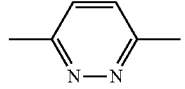

(107)

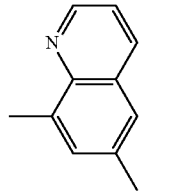

(108)

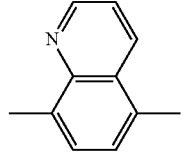

(109)

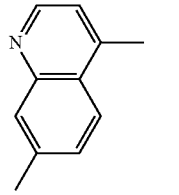

(110)

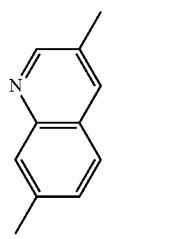

(111)

(112)
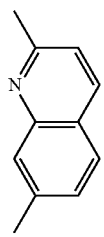
(113)
(114)
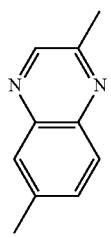
(115)
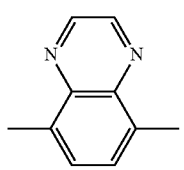
[Chemical formula 9]
(116)
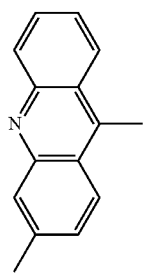
(117)
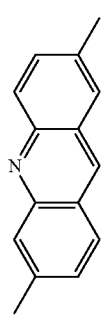
(118)
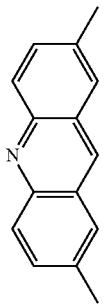
(119)
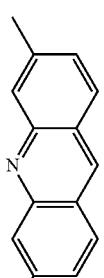
(120)
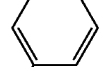
(121)
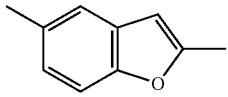
(122)
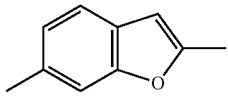
(123)
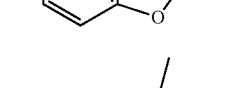
(124)
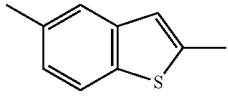
(125)
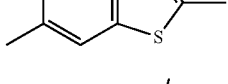
(126)
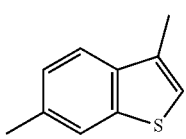
(127)

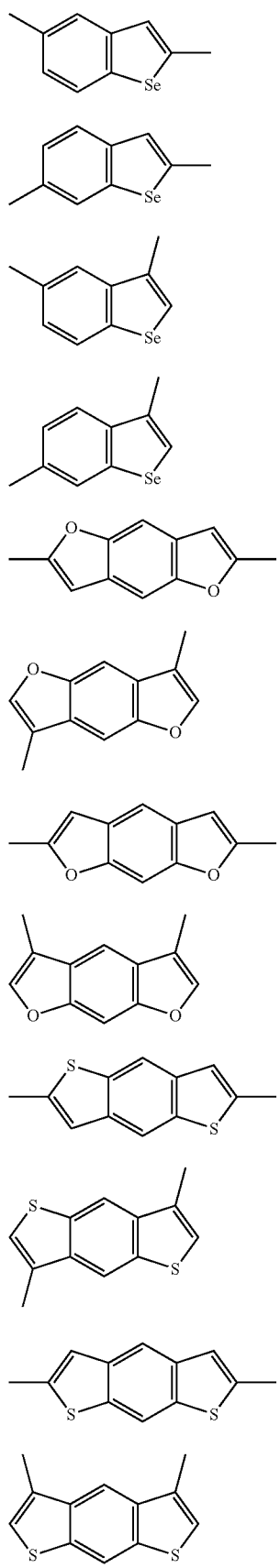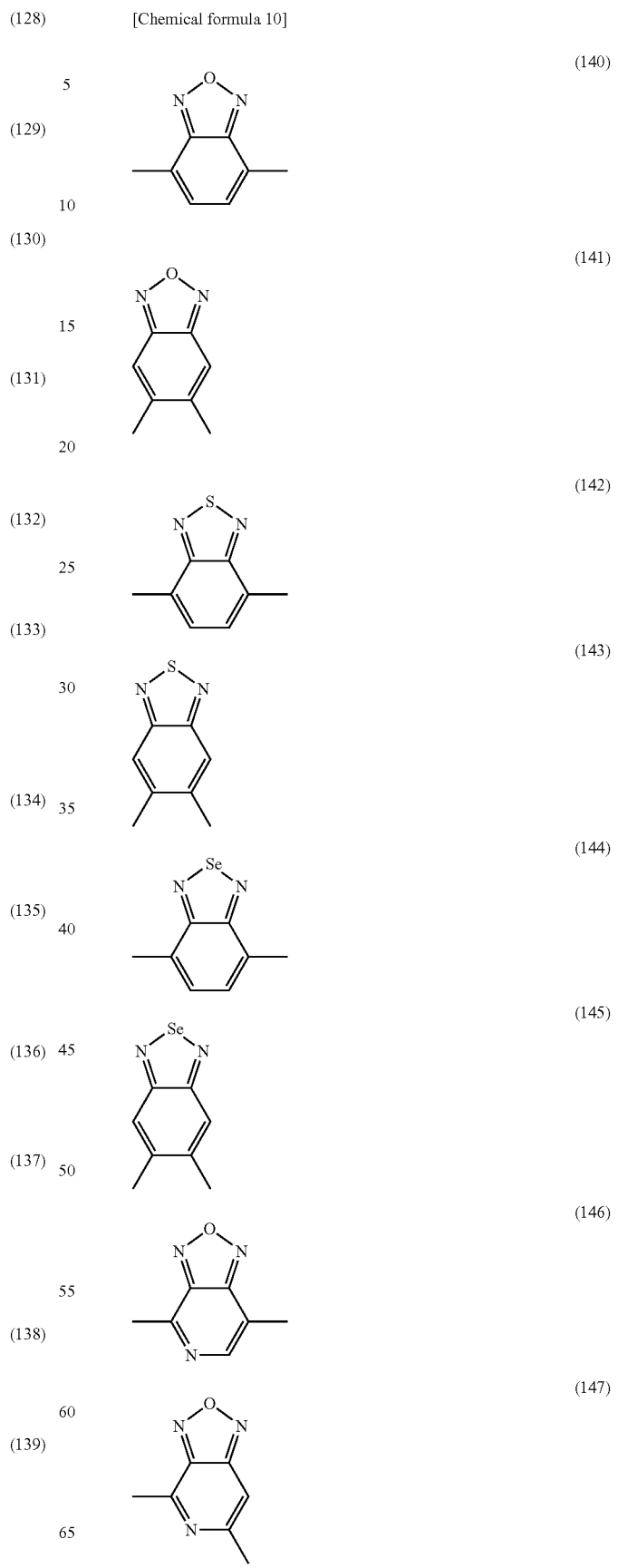

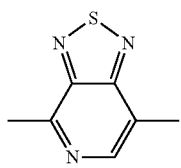
(148)
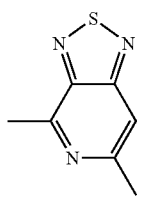
(149)
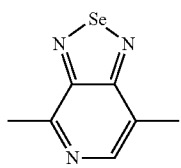
(150)
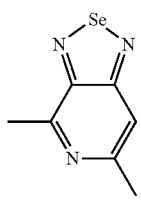
(151)
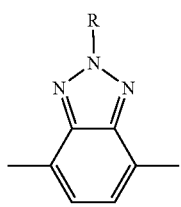
(152)
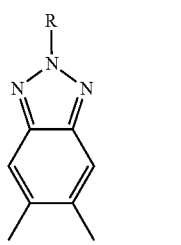
(153)
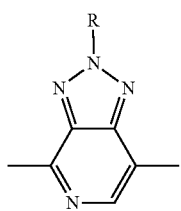
(154)
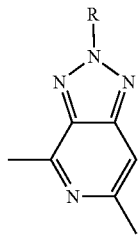
(155)
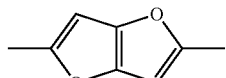
(156)
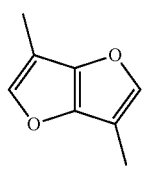
(157)
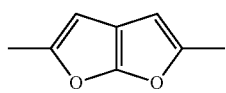
(158)
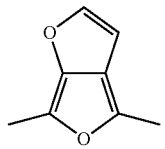
(159)
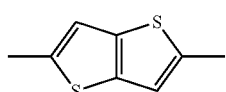
(160)
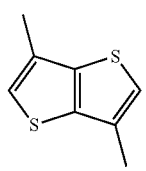
(161)
(162)
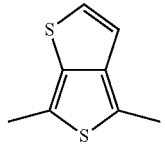
(163)
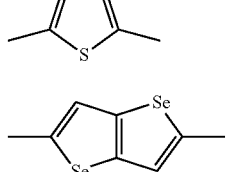
(164)
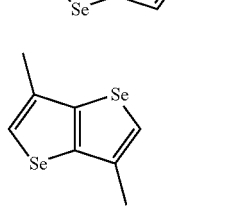
(165)

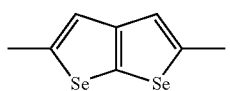
(166)
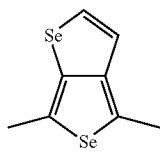
[Chemical formula 11]
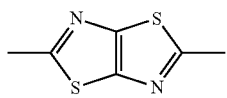
(167)
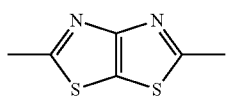
(168)
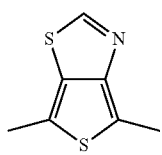
(169)
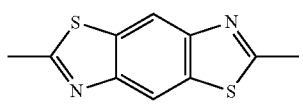
(170)
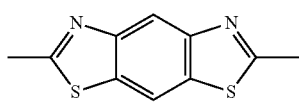
(171)
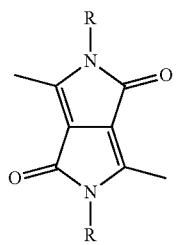
(172)
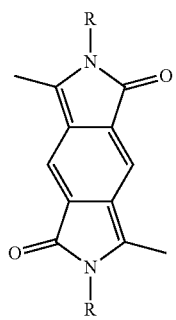
(173)
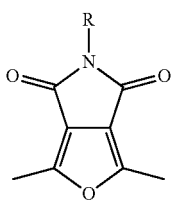
(174)
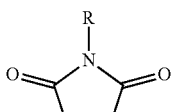
(175)
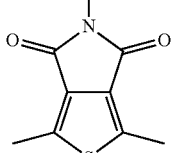
(176)
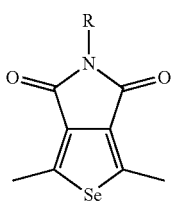
(177)
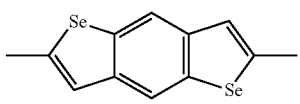
(178)
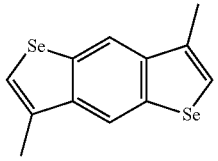
(179)
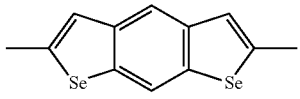
(180)
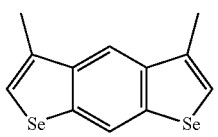
(181)
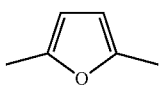
(182)
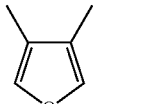
(183)
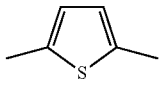
(184)
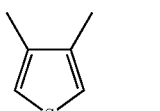
(185)

In formulae (101) to (185), R has the same meaning as described above. When there are a plurality of Rs, the Rs may be the same as or different from each other.

It is preferable that the constitutional unit represented by formula (II) is each of constitutional units represented by the following formulae (II-1) to (II-6).

[Chemical formula 12]

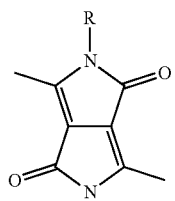
(II-1)

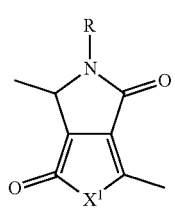
(II-2)

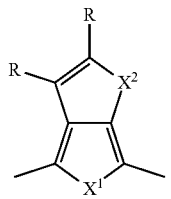
(II-3)

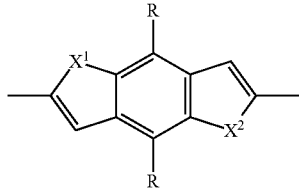
(II-4)

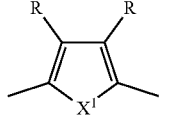
(II-5)

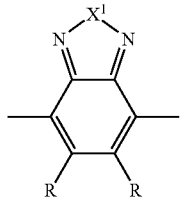
(II-6)

In formulae (II-1) to (II-6), $X^1$ and $X^2$ are each independently an oxygen atom or a sulfur atom, and R has the same meaning as described above. When there are a plurality of Rs, the Rs may be the same as or different from each other.

From the viewpoint of availability of raw material compounds, it is preferable that all $X^1$ and $X^2$ in formulae (II-1) to (II-6) is a sulfur atom.

It is preferable that the p-type semiconductor material is a polymer compound having a constitutional unit containing a thiophene skeleton.

The polymer compound that is the p-type semiconductor material may contain two or more types of constitutional units represented by formula (I), or contain two or more types of constitutional units represented by formula (II).

In order to improve the solubility in the solvent, the polymer compound that is the p-type semiconductor material may contain a constitutional unit represented by the following formula (III).

[Chemical formula 13]

$$—Ar^4— \quad (III)$$

In formula (III), $Ar^4$ is an arylene group.

The arylene group represented by $Ar^4$ means an atomic group derived by removal of two hydrogen atoms from an aromatic hydrocarbon optionally having a substituent. The aromatic hydrocarbon also contains a compound having a fused ring and a compound in which two or more rings selected from the group consisting of an independent benzene ring and a fused ring are bonded directly or via a divalent group such as a vinylene group.

Examples of a substituent that may be in the aromatic hydrocarbon may include substituents that are the same as those exemplified as the substituent that may be in the heterocyclic compound.

The number of carbon atoms of the arylene group except for the substituent is usually 6 to 60, and preferably 6 to 20. The number of carbon atoms of the arylene group including the substituent is usually 6 to 100.

Examples of the arylene group may include a phenylene group (e.g., the following formulae 1 to 3), a naphthalene-diyl group (e.g., the following formulae 4 to 13), an anthracene-diyl group (e.g., the following formulae 14 to 19), a biphenyl-diyl group (e.g., the following formulae 20 to 25), a terphenyl-diyl group (e.g., the following formulae 26 to 28), a fused ring compound group (e.g., the following formulae 29 to 35), a fluorene-diyl group (e.g., the following formulae 36 to 38), and a benzofluorene-diyl group (e.g., the following formulae 39 to 46).

[Chemical formula 14]

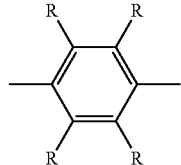
1

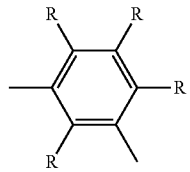
2

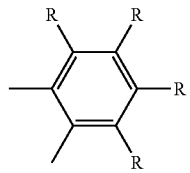
3

[Chemical formula 15]
4
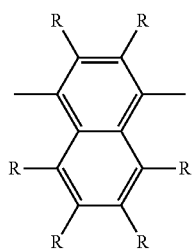
5
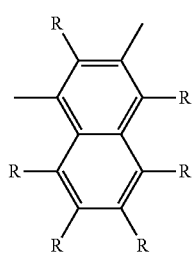
6
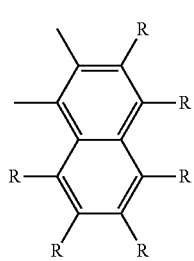
7
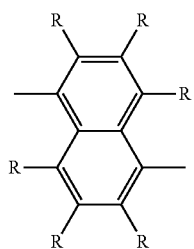
8
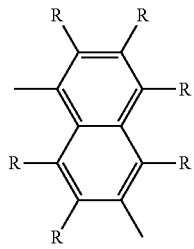
9
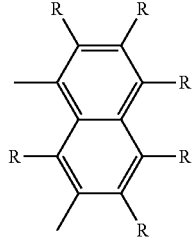
10
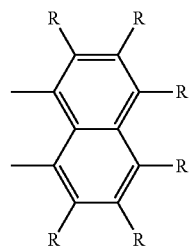
11
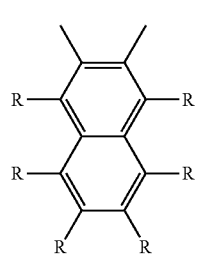
12
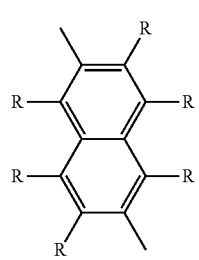
13
[Chemical formula 16]
14
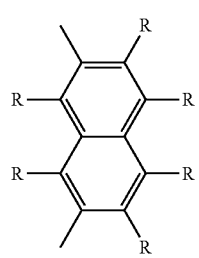

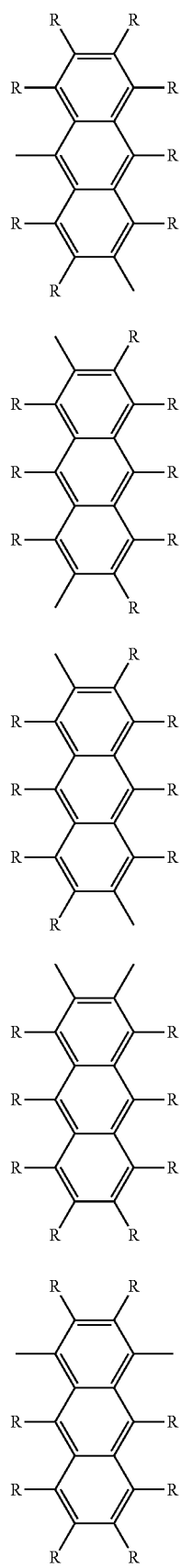
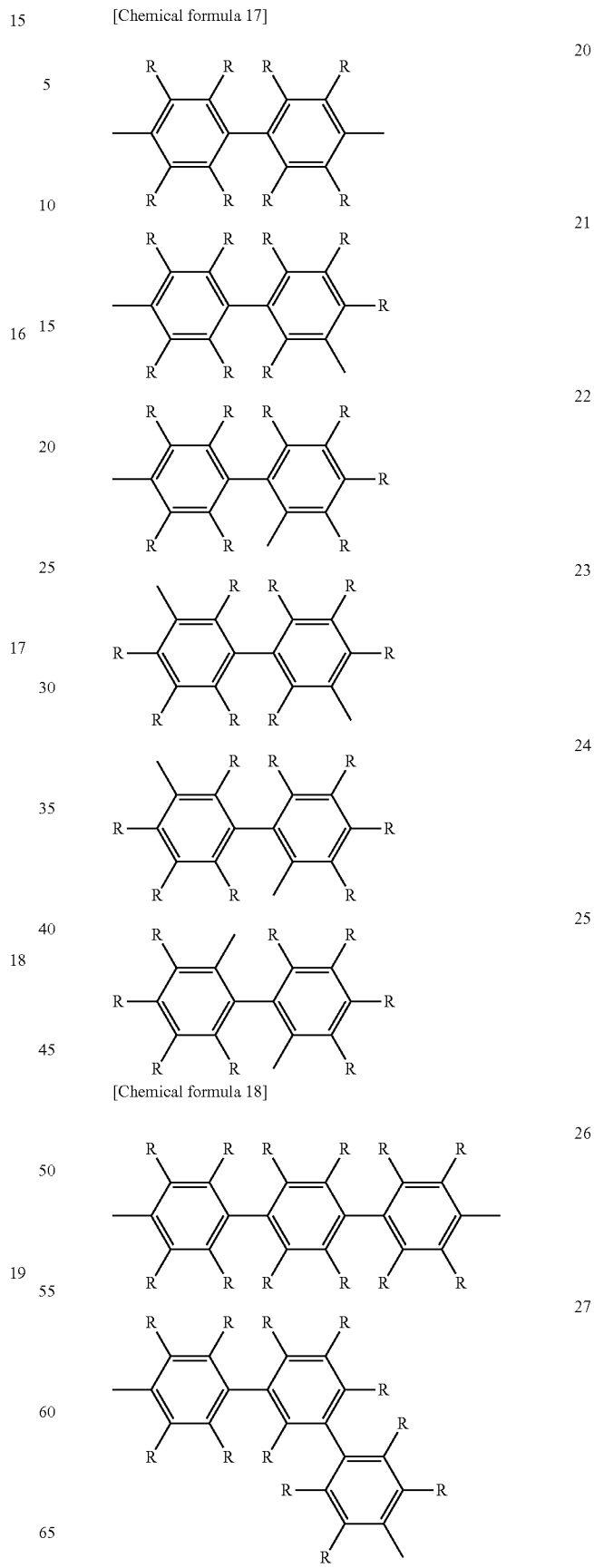

[Chemical formula 19]
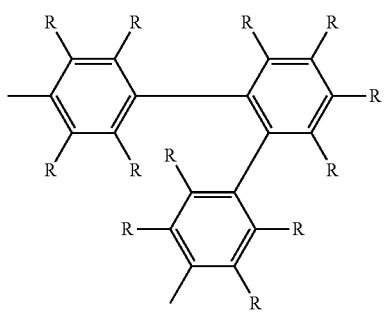
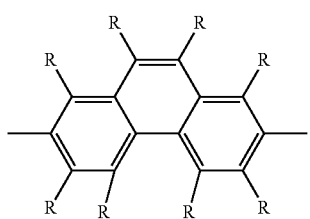
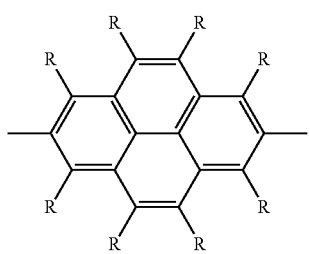
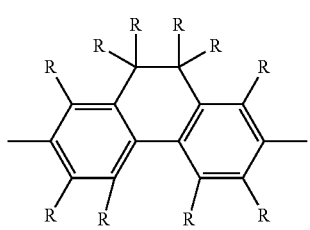
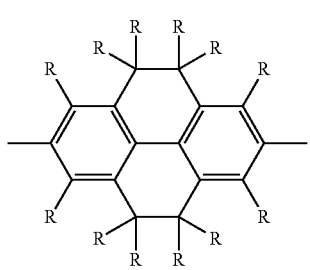
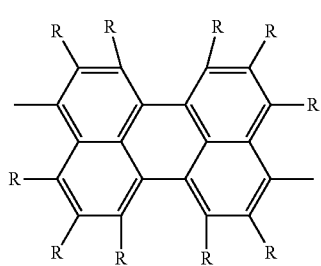
[Chemical formula 20]
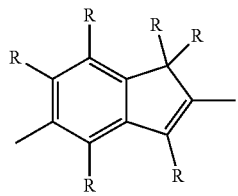
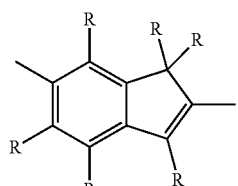
[Chemical formula 21]
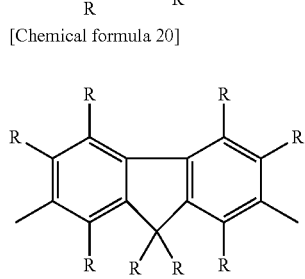
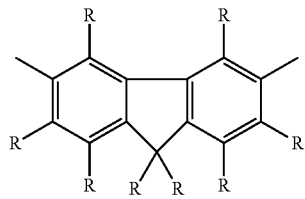
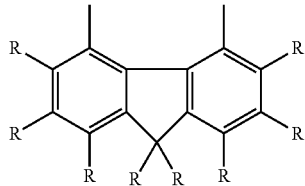
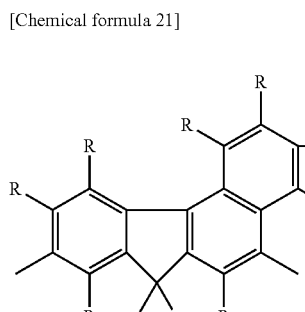
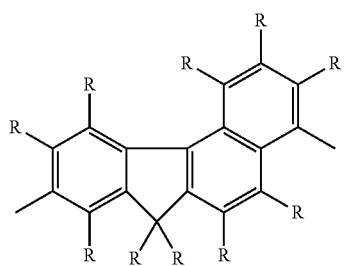

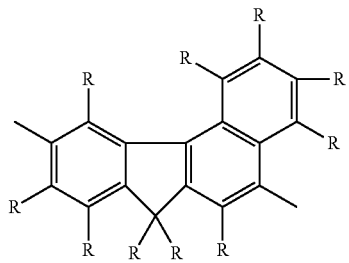
41

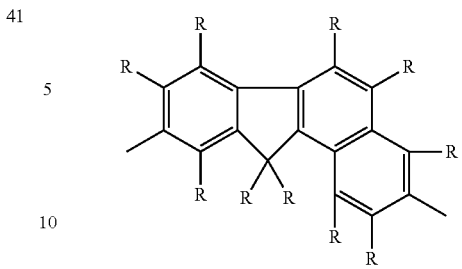
45

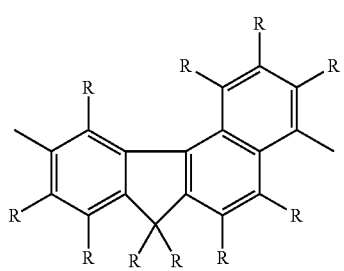
42

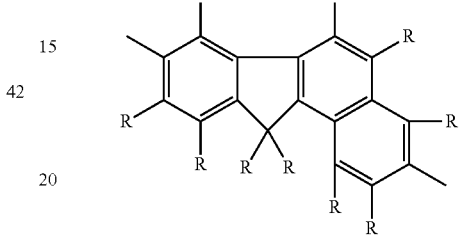
46

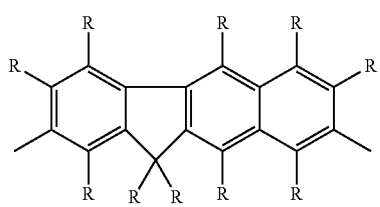
43

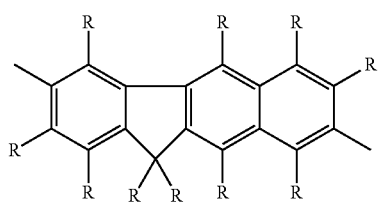
44

In formulae 1 to 46, R that is the substituent has the same meaning as described above. When there are a plurality of Rs, the Rs may be the same as or different from each other.

The constitutional unit constituting the polymer compound that is the p-type semiconductor material may be a constitutional unit in which two or more constitutional units that are two or more types of constitutional units selected from the constitutional unit represented by formula (I), the constitutional unit represented by formula (II), and the constitutional unit represented by formula (III) are connected in combination.

When the polymer compound that is the p-type semiconductor material contains the constitutional unit represented by formula (I) and/or the constitutional unit represented by formula (II), the total amount of the constitutional unit represented by formula (I) and the constitutional unit represented by formula (II) is usually 20 to 100% by mole relative to an amount of all constitutional units contained in the polymer compound of 100% by mole. The total amount is preferably 40 to 100% by mole, and more preferably 50 to 100% by mole since the charge transportation as the p-type semiconductor material can be improved.

Specific examples of the polymer compound that is the p-type semiconductor material may include polymer compounds represented by the following formulae P-1 to P-6.

[Chemical formula 22]

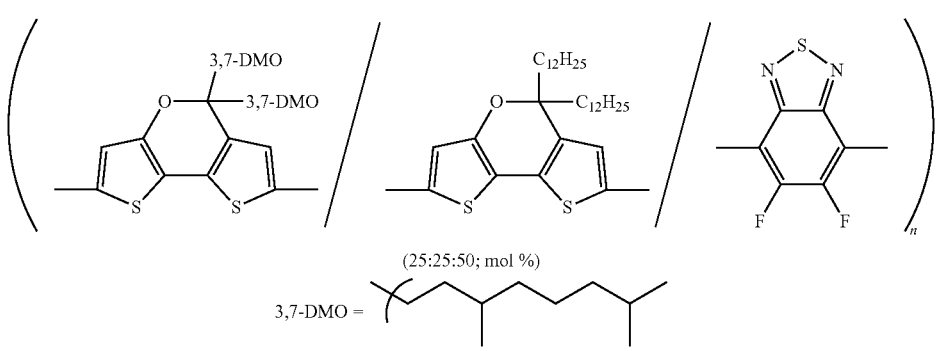

P-1

-continued

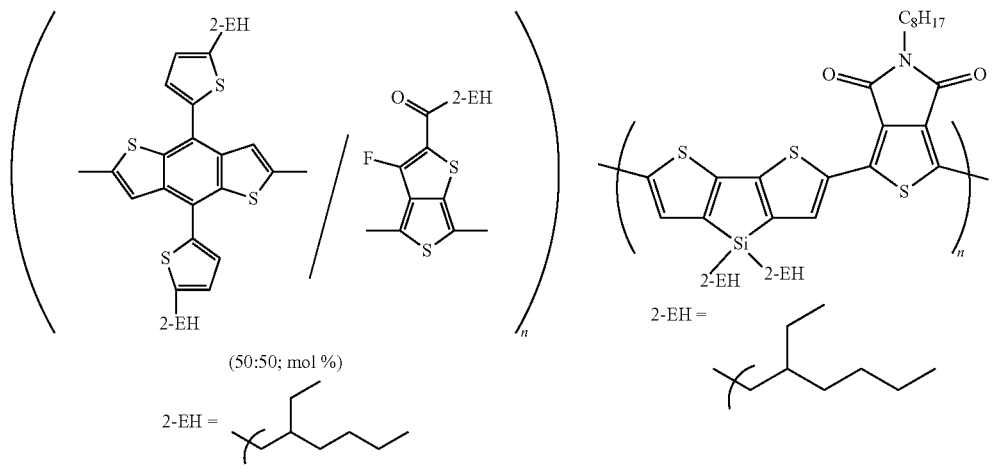

[Chemical formula 23]

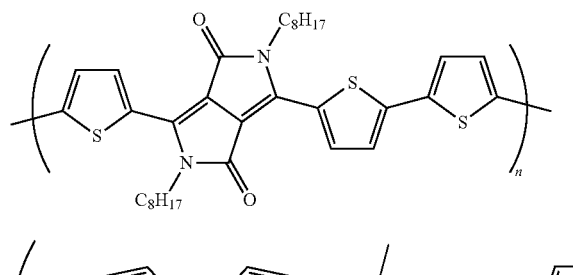

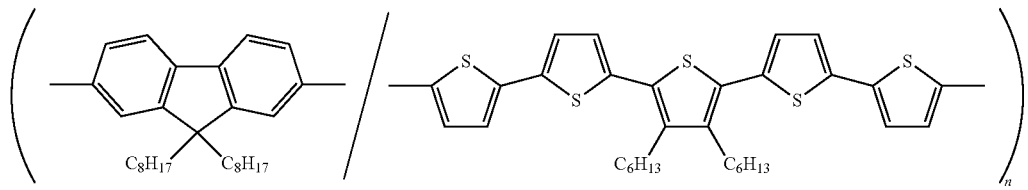

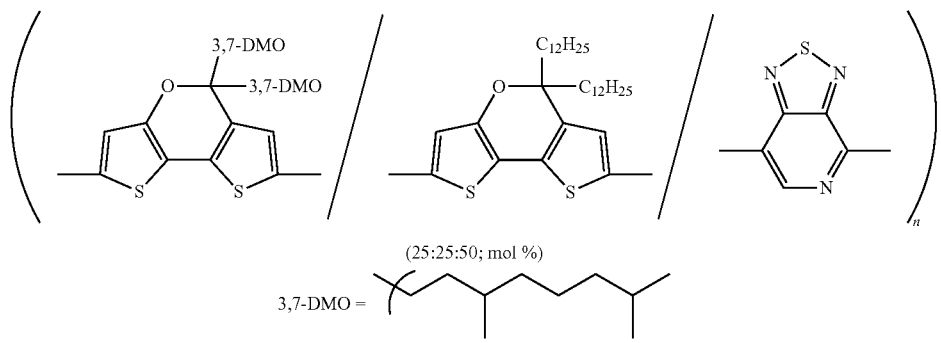

The ink may contain only one type of the p-type semiconductor material, or a combination of two or more types of the p-type semiconductor materials at an optional ratio.

(N-type Semiconductor Material)

The n-type semiconductor material may be a low molecular compound or a macromolecular compound.

Examples of the n-type semiconductor material (electron acceptor compound) that is the low molecular compound may include an oxadiazole derivative, an anthraquinodimethane and a derivative thereof, a benzoquinone and a derivative thereof, a naphthoquinone and a derivative thereof, an anthraquinone and a derivative thereof, a tetracyanoanthraquinodimethane and a derivative thereof, a fluorenone derivative, a diphenyldicyanoethylene and a derivative thereof, a diphenoquinone derivative, metal complexes of 8-hydroxyquinoline and a derivative thereof, fullerenes such as $C_{60}$ fullerene and a derivative thereof, and a phenanthrene derivative such as bathocuproine.

Examples of the n-type semiconductor material (electron acceptor compound) that is the macromolecular compound may include a polyvinylcarbazole and a derivative thereof, a polysilane and a derivative thereof, a polysiloxane having an aromatic amine structure in a side chain or a main chain, a polyaniline and a derivative thereof, a polythiophene and a derivative thereof, a polypyrrole and a derivative thereof, a polyphenylenevinylene and a derivative thereof, a polythienylenevinylene and a derivative thereof, a polyquinoline and a derivative thereof, a polyquinoxaline and a derivative thereof, and a polyfluorene and a derivative thereof.

The n-type semiconductor material is preferably one or more selected from a fullerene and a fullerene derivative, and more preferably a fullerene derivative.

Examples of the fullerene may include a $C_{60}$ fullerene, a $C_{70}$ fullerene, a $C_{76}$ fullerene, a $C_{78}$ fullerene, and a $C_{84}$ fullerene. Examples of the fullerene derivative may include derivatives of the fullerenes. The fullerene derivative means a compound in which at least a part of a fullerene is modified.

Examples of the fullerene derivative may include compounds represented by the following formulae (N-1) to (N-4).

[Chemical formula 24]

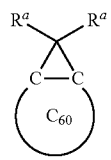
(N-1)

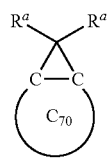
(N-2)

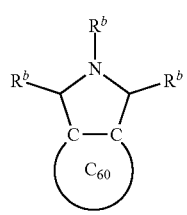
(N-3)

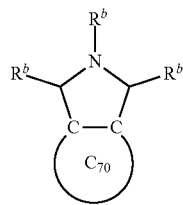
(N-4)

In formulae (N-1) to (N-4), $R^a$ is an alkyl group, an aryl group, a monovalent heterocyclic group, or a group having an ester structure. A plurality of $R^a$s may be the same as or different from each other.

$R^b$ is an alkyl group or an aryl group. A plurality of $R^b$s may be the same as or different from each other.

Examples of the group having an ester structure represented by $R^a$ may include a group represented by the following formula (19).

[Chemical formula 25]

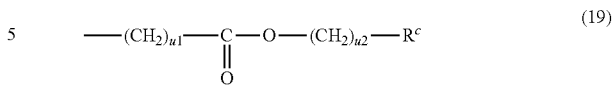

In formula (19), u1 is an integer of 1 to 6. u2 is an integer of 0 to 6. $R^c$ is an alkyl group, an aryl group, or a monovalent heterocyclic group.

Examples of the $C_{60}$ fullerene derivative may include the following compounds.

[Chemical formula 26]

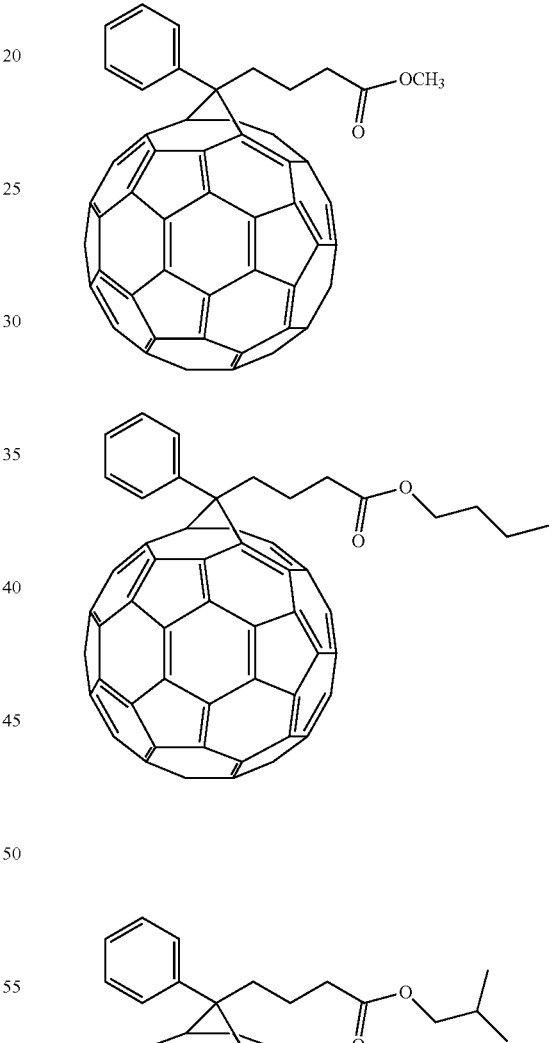

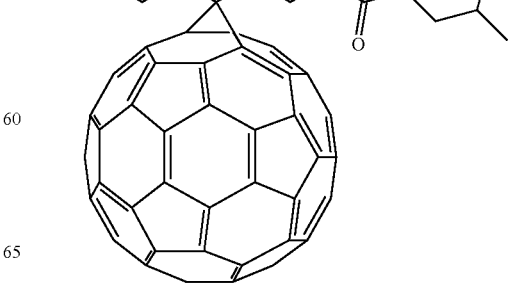

-continued

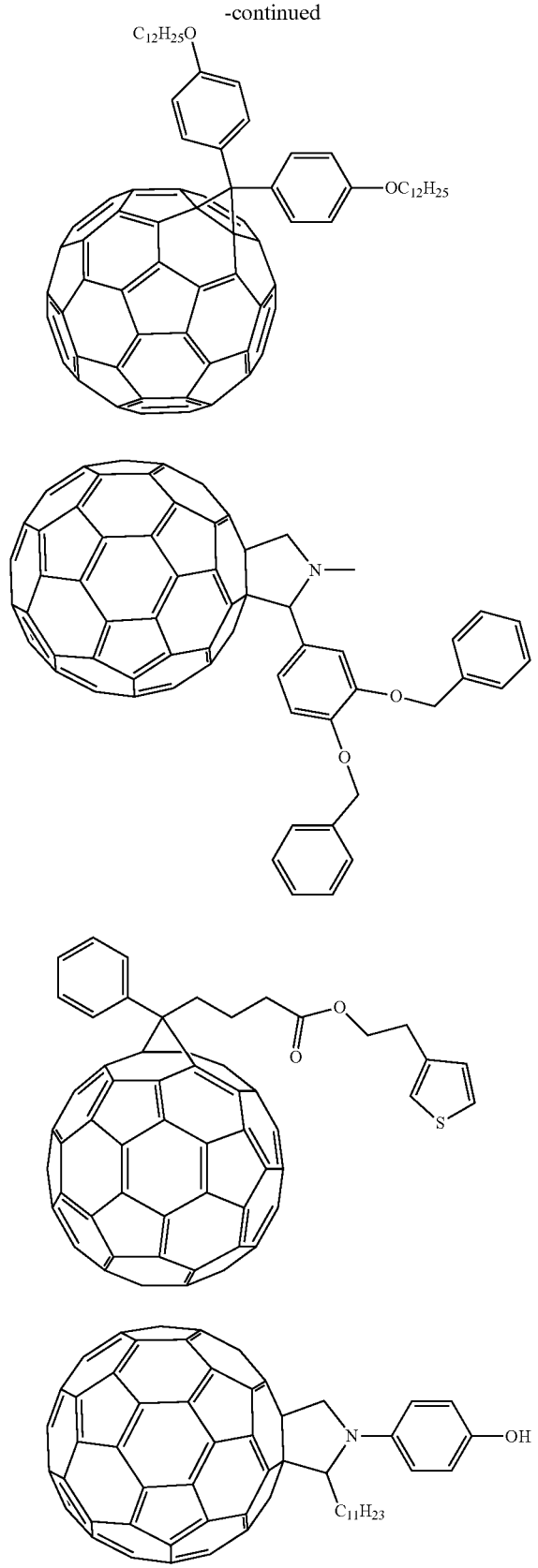

Examples of the C70 fullerene derivative may include the following compounds.

[Chemical formula 27]

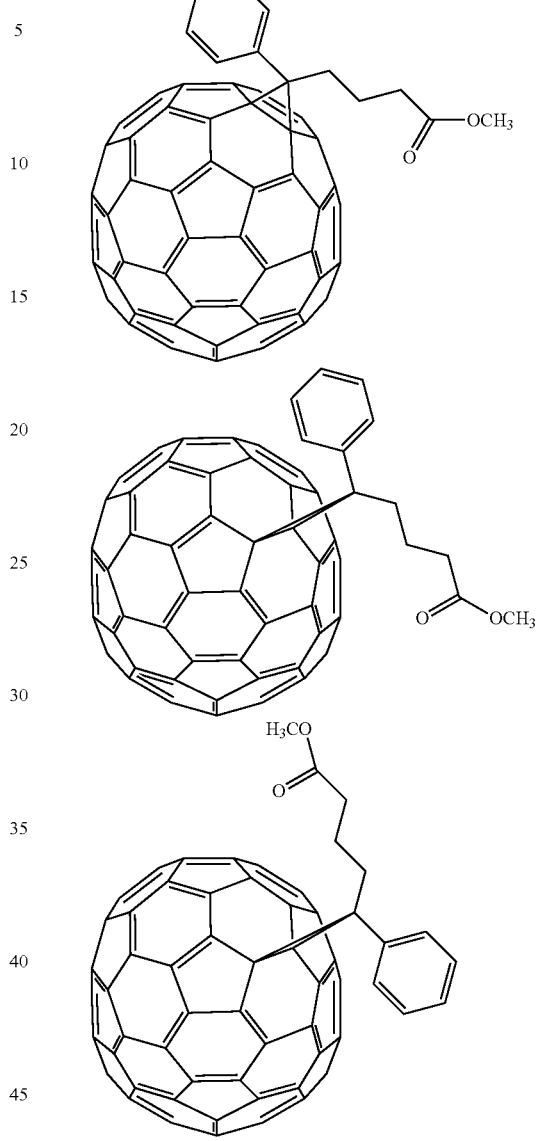

Specific examples of the fullerene derivative may include [6,6]-phenyl-C61 butyric acid methyl ester (C60PCBM), [6,6]-phenyl-C71 butyric acid methyl ester (C70PCBM), [6,6]-phenyl-C85 butyric acid methyl ester (C84PCBM), and [6,6]-thienyl-C61 butyric acid methyl ester.

The ink may contain only one type of the n-type semiconductor material, or a combination of two or more types of the n-type semiconductor materials at an optional ratio.

(Ratio by Weight (P/N Ratio) of P-Type Semiconductor Material and N-Type Semiconductor Material)

The ratio by weight p/n (p-type semiconductor material/ n-type semiconductor material) of the p-type semiconductor material and the n-type semiconductor material in the ink is preferably 9/1 to 1/9, more preferably 2/1 to 1/9, and further preferably 1/1 to 1/9. From the viewpoint of making the junction length between the phase of the p-type semiconductor material and the phase of the n-type semiconductor material within a suitable range when the photoelectric conversion element is especially a photodetector, the ratio by weight is particularly preferably 1/1 to 1/2.5. The p/n ratio can be used as an indication for adjustment of junction length between the phase of the p-type semiconductor material and the phase of the n-type semiconductor material.

(First Solvent)

The solvent may be selected in consideration of solubility of the selected p-type semiconductor material and n-type semiconductor material and properties (boiling point, etc.) corresponding to a drying condition during formation of the active layer.

The first solvent that is a main solvent is an aromatic hydrocarbon (hereinafter simply referred to as aromatic hydrocarbon) optionally having a substituent (e.g., alkyl group or halogen atom). It is preferable that the first solvent be selected in consideration of the solubility of the selected p-type semiconductor material and n-type semiconductor material.

Examples of such an aromatic hydrocarbon may include toluene, xylene (e.g., o-xylene, m-xylene, and p-xylene), trimethylbenzene (e.g., mesitylene and 1,2,4-trimethylbenzene (pseudocumene)), butylbenzene (e.g., n-butylbenzene, sec-butylbenzene, and tert-butylbenzene), methylnaphthalene (e.g., 1-methylnaphthalene), tetralin, indane, chlorobenzene, and dichlorobenzene (o-dichlorobenzene).

The first solvent may include only one type of the aromatic hydrocarbon or two or more types of the aromatic hydrocarbons. It is preferable that the first solvent include only one type of the aromatic hydrocarbon.

It is preferable that the first solvent contain one or more types selected from the group consisting of toluene, o-xylene, m-xylene, p-xylene, mesitylene, pseudocumene, n-butylbenzene, sec-butylbenzene, tert-butylbenzene, methylnaphthalene, tetralin, indane, chlorobenzene, and o-dichlorobenzene, and it is more preferable that the first solvent contain o-xylene, pseudocumene, tetralin, chlorobenzene, or o-dichlorobenzene.

(Second Solvent)

It is preferable that the second solvent is a solvent especially selected from the viewpoint of enhancing the solubility of the n-type semiconductor material. Examples of the second solvent may include ketone solvents such as acetone, methylethylketone, cyclohexanone, acetophenone, and propiophenone, and ester solvents such as ethylacetate, butylacetate, phenylacetate, ethylcellosolveacetate, methylbenzoate, butylbenzoate, and benzylbenzoate.

From the viewpoint of reducing a dark current, it is preferable that the second solvent be acetophenone, propiophenone, or benzylbenzoate.

(Combination of First Solvent with Second Solvent)

Examples of combination of the first solvent with the second solvent may include combinations shown in the Table 1 below.

TABLE 1

| First solvent | Second solvent |
|---|---|
| pseudocumene | propiophenone |
| pseudocumene | benzylbenzoate |
| tetralin | propiophenone |
| o-xylene | acetophenone |

(Ratio by Weight of First Solvent and Second Solvent)

From the viewpoint of further improving the solubility of the p-type semiconductor material and the n-type semiconductor material, it is preferable that the ratio by weight (first solvent/second solvent) of the first solvent that is a main solvent to the second solvent that is an added solvent be within a range of 85/15 to 95/5.

(Total Percentage by Weight of First Solvent and Second Solvent in Ink)

From the viewpoint of further improving the solubility of the p-type semiconductor material and the n-type semiconductor material, the total weight of the first solvent and the second solvent in the ink is preferably 90% by weight or more, more preferably 92% by weight or more, and further preferably 95% by weight or more when the total weight of the ink is 100% by weight. From the viewpoint of increasing the concentrations of the p-type semiconductor material and the n-type semiconductor material in the ink and facilitating formation of a film having equal to or more than predetermined thickness, it is preferably 99% by weight or less, more preferably 98% by weight or less, and further preferably 97.5% by weight or less.

(Optional Solvent)

The ink may contain an optional solvent other than the first solvent and the second solvent. When the total weight of all the solvents in the ink is 100% by weight, the content of the optional solvent is preferably 5% by weight or less, more preferably 3% by weight or less, and further preferably 1% by weight or less. It is preferable that the optional solvent is a solvent having a boiling point higher than that of the second solvent.

(Optional Component)

In addition to the first solvent, the second solvent, the p-type semiconductor material, and the n-type semiconductor material, the ink may contain optional components such as an ultraviolet light absorber, an antioxidant, a sensitizer for sensitizing a function of generating a charge by absorbed light, and a light stabilizer for enhancing stability to ultraviolet light without impairing the objects and effects of the present invention.

(Concentration of P-Type Semiconductor Material and N-Type Semiconductor Material in Ink)

The total concentration of the p-type semiconductor material and the n-type semiconductor material in the ink is preferably 0.01% by weight or more and 20% by weight or less, more preferably 0.01% by weight or more and 10% by weight or less, further preferably 0.01% by weight or more and 5% by weight or less, and particularly preferably 0.1% by weight or more and 5% by weight or less. In the ink, the p-type semiconductor material and the n-type semiconductor material may be dissolved or dispersed. It is preferable that at least a part of the p-type semiconductor material and the n-type semiconductor material is dissolved, and it is more preferable that all the p-type semiconductor material and the n-type semiconductor material is dissolved.

(Preparation of Ink)

The ink can be prepared by a known method. For example, the ink can be prepared by a method in which the first solvent and the second solvent are mixed to prepare a mixed solvent, and the p-type semiconductor material and the n-type semiconductor material are added to the mixed solvent, a method in which the p-type semiconductor material is added to the first solvent, the n-type semiconductor material is added to the second solvent, and the first solvent and the second solvent that contain each of the materials are mixed, or the like.

The first solvent and the second solvent and the p-type semiconductor material and the n-type semiconductor material may be mixed with heating at a temperature equal to or lower than the boiling points of the solvents.

The first solvent and the second solvent and the p-type semiconductor material and the n-type semiconductor material are mixed, and the obtained mixture is filtered through a filter. Thus, the obtained filtrate may be used as the ink. As the filter, for example, a filter made of a fluorine resin such as polytetrafluoroethylene (PTFE) can be used.

EXAMPLES

Hereinafter, Examples will be shown to describe the present invention in more details. The present invention is not limited to Examples described below.

In Examples, a p-type semiconductor material (electron donor compound) illustrated in Table 2 and an n-type semiconductor material (electron acceptor compound) illustrated in Table 3 were used.

TABLE 2

| Number | Chemical structure |
|---|---|
| n-type semiconductor material P-1 | 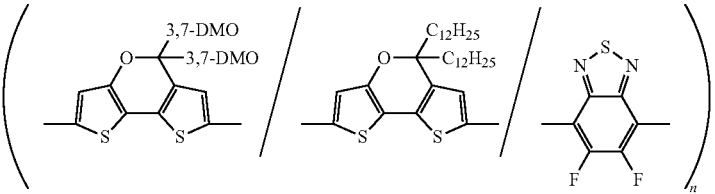 (25:25:50; mol %) 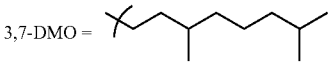 |
| P-2 | 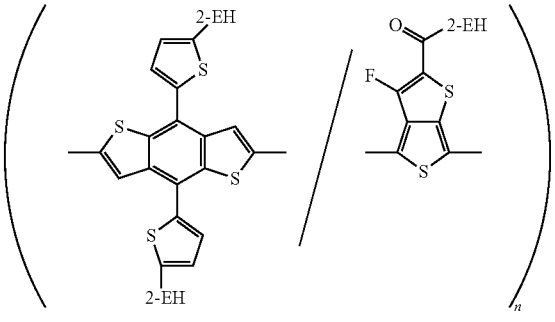 (50:50; mol %) 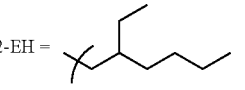 |
| P-3 | 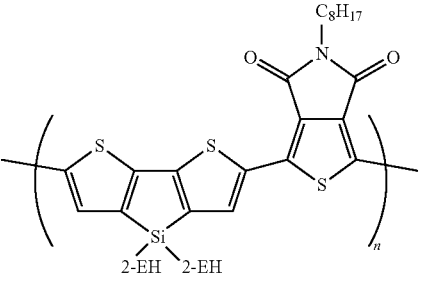 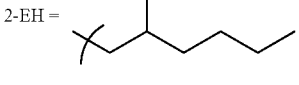 |
| P-4 | 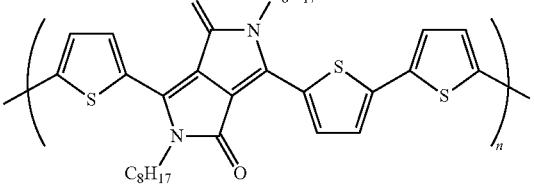 |

TABLE 2-continued

| Number | Chemical structure |
|---|---|
| P-5 | 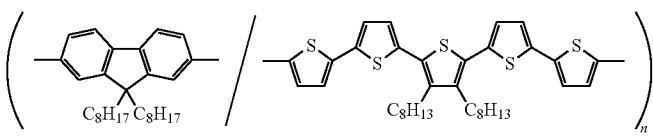 (50:50; mol %) |
| P-6 | 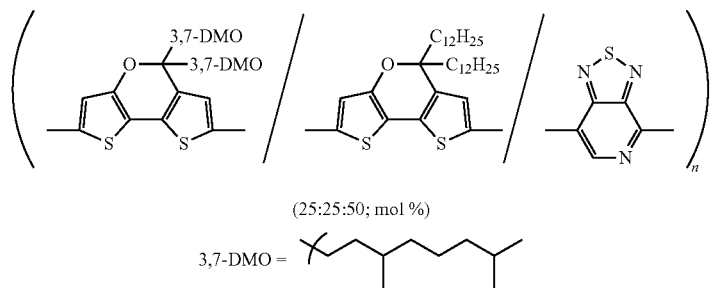 (25:25:50; mol %) <br> 3,7-DMO = 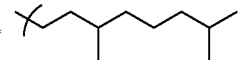 |

TABLE 3

| Number | Chemical structure |
|---|---|
| n-type semiconductor material | N-1' 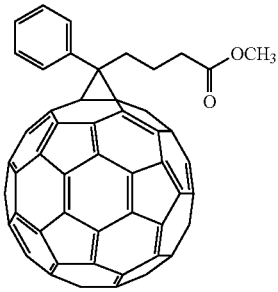 C60PCBM |
| | N-2' 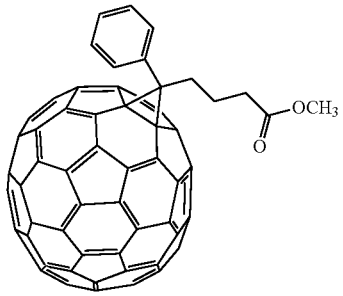 C70PCBM |

A polymer compound P-1 that was a p-type semiconductor material was synthesized with reference to a method described in International publication WO 2013/051676, and used.

As a polymer compound P-2 that was a p-type semiconductor material, PCE10 (trade name, available from 1-material) was commercially obtained and used.

As a polymer compound P-3 that was a p-type semiconductor material, PDTSTPD (trade name, available from 1-material) was commercially obtained and used.

As a polymer compound P-4 that was a p-type semiconductor material, PDPP3T (trade name, available from Lumtec) was commercially obtained and used.

A polymer compound P-5 that was a p-type semiconductor material was synthesized with reference to a method described in JP 2010-74127 A, and used.

A polymer compound P-6 that was a p-type semiconductor material was synthesized with reference to a method described in International publication WO 2011/052709, and used.

As a compound N-1' that was an n-type semiconductor material, E100 (trade name, available from Frontier Carbon Corporation) was commercially obtained and used.

As a compound N-2' that was an n-type semiconductor material, ADS71BFA (trade name, available from American dye source, Inc.) was commercially obtained and used.

Solvents used in Examples and boiling points (° C.) thereof are shown in Table 4.

TABLE 4

| Solvent | Boiling point (° C.) |
|---|---|
| pseudocumene | 169 |
| propiophenone | 208 |
| benzylbenzoate | 323 |
| tetralin | 206 |
| o-xylene | 145 |
| acetophenone | 202 |
| chlorobenzene | 131 |
| o-dichlorobenzene | 181 |

Preparation Example 1

(Preparation of Ink)

A mixed solvent was prepared by using pseudocumene as a first solvent and propiophenone as a second solvent at a ratio by weight of the first solvent to the second solvent of 95:5. In the prepared mixed solvent, the polymer compound P-1 that was a p-type semiconductor material and the compound N-1' that was an n-type semiconductor material were mixed so that the concentration of the p-type semiconductor material in the total weight of an ink was 1% by weight and the concentration of the n-type semiconductor material in the total weight of the ink was 2.5% by weight (p-type semiconductor material/n-type semiconductor material=1/2.5 (hereinafter referred to as p/n ratio)), and stirred at 80° C. for 12 hours. The obtained mixed solution was then filtered through a PTFE filter having a pore diameter of 5 μm, to obtain an ink (I-1).

Preparation Examples 2 to 3 and Comparative Preparation Examples 1 to 5

Inks (I-2) to (I-3) and (C-1) to (C-5) were each prepared by using a first solvent and a second solvent as a mixed solvent in combination at a mixing ratio (% by weight) or a single solvent shown in Table 5, in addition to a p-type semiconductor material (the weight average molecular weight (Mw) is shown together) and an n-type semiconductor material that were the same as those in Preparation Example 1.

TABLE 5

|  | Ink | First solvent | Second solvent | Mixing ratio (% by weight) | Molecular weight of p-type semiconductor material (Mw) | p/n ratio |
| --- | --- | --- | --- | --- | --- | --- |
| Preparation example 1 | I-1 | pseudocumene | propiophenone | 95/5 | 62200 | 1/2.5 |
| Preparation example 2 | I-2 | pseudocumene | propiophenone | 95/5 | 62200 | 1/1 |
| Preparation example 3 | I-3 | pseudocumene | propiophenone | 95/5 | 78900 | 1/1 |
| Comparative preparation example 1 | C-1 | pseudocumene | propiophenone | 95/5 | 204000 | 1/2.5 |
| Comparative preparation example 2 | C-2 | chlorobenzene | — | — | 62200 | 1/2 |
| Comparative preparation example 3 | C-3 | pseudocumene | propiophenone | 95/5 | 78900 | 1/1 |
| Comparative preparation example 4 | C-4 | pseudocumene | benzylbenzoate | — | 39600 | 1/1 |
| Comparative preparation example 5 | C-5 | chlorobenzene | — | — | 39600 | 1/3 |

Example 1

(Preparation and Evaluation of Photoelectric Conversion Element)

A glass substrate on which a thin film of ITO (anode) with a thickness of 150 nm was formed by a sputtering method was prepared, and subjected to an ozone UV treatment as a surface treatment.

A suspension in which poly(3,4-ethylenedioxythiophene) and polystyrene sulfonic acid (PEDOT/PSS) were dissolved in water (Clevios P VP AI4083, available from Heraeus) was then filtered through a filter having a pore diameter of 0.45 μm. The suspension after the filtration was applied to the thin film of ITO of the glass substrate at a thickness of 40 nm by a spin coating method to form a coating film.

Subsequently, the glass substrate having the coating film was dried in air on a hot plate at 200° C. for 10 minutes, to form a hole transport layer as a solidified film.

The ink (I-1) was then applied to the formed hole transport layer by a spin coating method, to form a coating film, and the coating film was dried on a hot plate heated to 70° C., to form an active layer. The formed active layer had a thickness of approximately 100 nm.

Next, a 45% by weight dispersion liquid of zinc oxide nanoparticles (particle diameter: 20 to 30 nm) in isopropanol (2-propanol) (HTD-711Z, available from Tayca Corporation) was diluted with 3-pentanol in an amount of 10-fold parts by weight of the isopropanol dispersion liquid, to prepare a coating liquid.

The obtained coating liquid was applied to the active layer at a thickness of 40 nm by a spin coating method, and the glass substrate having the coating film was dried under a nitrogen gas atmosphere to form an electron transport layer.

Subsequently, an Ag layer having a thickness of approximately 80 nm was formed as a cathode on the active layer in a resistive heating vapor deposition apparatus.

Next, a UV-curing sealant was applied to the periphery of the formed layered body, bonded to the glass substrate that was a sealing substrate, and irradiated with UV light. The layered body was sealed to obtain a photoelectric conversion element. The planar shape as viewed in a thickness direction of the obtained photoelectric conversion element was a 1 cm×1 cm square.

A dark current was measured using the obtained photoelectric conversion element. In the measurement of a dark current, a semiconductor parameter analyzer (Agilent technology B1500A, manufactured by Agilent Technologies) was used. A value of dark current during application of −5 V was 5.42E-4 A/cm$^2$.

(Observation of Phase Separation Structure)

An active layer was formed on a substrate as described in Example 1 above. The junction length of a phase separation structure between a phase containing a p-type semiconductor material and a phase containing an n-type semiconductor material in the formed active layer was observed using a 20 eV loss image obtained by an electron energy-loss spectroscopy (TEM-EELS) with a transmission electron microscope (TEM). The slit width when the 20 eV loss image was photographed was 10 eV.

A substance obtained by adding dropwise a polyvinylpyrrolidone aqueous solution to an active layer film formed on a substrate by a spin coating method, followed by drying and separating was floated in water, and scooped by a grid for TEM, to obtain a sample for observation of the phase separation structure. In the observation, TEM (JEM2200FS, manufactured by JEOL Ltd.) was used at an acceleration voltage of 200 kV and a 20-eV loss image with 1024×1024 pixels of a layer within a range of 824 nm×824 nm at a magnification of 20,000 was used.

(Method for Calculating Junction Length)

A junction length (interface length) was calculated by a method including the following steps using computer hardware and software.

Step (i): A computer read an obtained 20 eV loss image (TEM image) using ImageJ (image processing software).

Step (ii): The computer converted the read image to a 16-bit grayscale image using ImageJ.

Step (iii): The computer executed background correction of the converted 16-bit grayscale image under a condition of a rolling ball radius of 20 pixels.

Step (iv): The computer applied a median filter of 12 pixels to the image subjected to the background correction.

Step (v): The computer executed binarization for the image processed by the median filter using Otsu's method.

Step (vi): The computer extracted an interface on the image binarized by processing with a command of Find Edge.

Step (vii): The computer calculated the area of the interface extracted by processing with a command of Measure.

Step (viii): The computer divided the area of the obtained interface by a length of one pixel to obtain a result as "junction length."

Step (ix): The computer divided the obtained junction length by a visual field area to determine the junction length per unit area. The results are shown in Table 6.

Examples 2 to 3 and Comparative Examples 1 to 5

Each photoelectric conversion element was prepared in the same manner as in Example 1 described except for using the ink (I-2) in Example 2 or the ink (I-3) in Example 3, and evaluated. Each photoelectric conversion element was produced in the same manner as in Example 1 described except for using the inks (C-1) to (C-5) in Comparative Examples 1 to 5, respectively, and evaluated. The results are shown in Table 6.

TABLE 6

|  | Ink | Junction length (μm) | Dark current at −5 V (A/cm$^2$) |
|---|---|---|---|
| Example 1 | I-1 | 140.0 | 5.42E−4 |
| Example 2 | I-2 | 152.3 | 2.30E−4 |
| Example 3 | I-3 | 163.5 | 3.80E−4 |
| Comparative example 1 | C-1 | 149.6 | 9.73E−3 |
| Comparative example 2 | C-2 | 110.4 | 1.69E−3 |
| Comparative example 3 | C-3 | 205.7 | 2.27E−3 |
| Comparative example 4 | C-4 | 135.5 | 1.79E−3 |
| Comparative example 5 | C-5 | 100.2 | 8.27E−2 |

In the photoelectric conversion elements of Examples 1 to 3 in which the junction length was 130 μm or more and less than 200 μm and the weight average molecular weight of the p-type semiconductor material was 40,000 or more and 200,000 or less, the values of dark current at −5 V were 2.30E-4 to 5.42E-4, which were significantly lower than those of the photoelectric conversion elements of Comparative Examples 1 to 5 in which one or both of the requirements were not satisfied.

Preparation Examples 4 to 6 and Comparative Preparation Examples 6 to 10

Inks (I-4) to (I-6) and (C-6) to (C-10) were each prepared in the same manner as in Preparation Example 1 described by using a mixed solvent of a first solvent and a second solvent in combination at a mixing ratio (% by weight) shown in Table 7, the polymer compound P-2 (1% by weight in the whole ink) that was a p-type semiconductor material, and the compound N-1' that was an n-type semiconductor material.

TABLE 7

|  | Ink | First solvent | Second solvent | Mixing ratio (% by weight) | Molecular weight of p-type semiconduct or material (Mw) | p/n ratio |
|---|---|---|---|---|---|---|
| Preparation example 4 | I-4 | chlorobenzene | — | — | 144000 | 1/2 |
| Preparation example 5 | I-5 | chlorobenzene | — | — | 144000 | 1/1 |
| Preparation example 6 | I-6 | tetralin | — | — | 144000 | 1/1 |
| Comparative preparation example 6 | C-6 | pseudocumene | propiophenone | 95/5 | 204000 | 1/1.5 |
| Comparative preparation example 7 | C-7 | o-dichlorobenzene | — | — | 144000 | 1/2 |
| Comparative preparation example 8 | C-8 | o-dichlorobenzene | — | — | 144000 | 1/1 |
| Comparative preparation example 9 | C-9 | o-dichlorobenzene | — | — | 39000 | 1/1.5 |
| Comparative preparation example 10 | C-10 | pseudocumene | propiophenone | 90/10 | 39000 | 1/1.5 |

Examples 4 to 6 and Comparative Examples 6 to 10

Each photoelectric conversion element was produced in the same manner as in Example 1 described except for using the inks (I-4) to (I-6) and (C-6) to (C-10) in Examples 4 to 6 and Comparative Examples 6 to 10, respectively, and evaluated in the same manner. The results are shown in Table 8.

TABLE 8

|  | Ink | Junction length (μm) | Dark current at −5 V (A/cm$^2$) |
|---|---|---|---|
| Example 4 | I-4 | 158.9 | 1.66E−4 |
| Example 5 | I-5 | 194.3 | 2.61E−4 |
| Example 6 | I-6 | 162.9 | 2.38E−4 |
| Comparative Example 6 | C-6 | 158.7 | 5.57E−2 |
| Comparative Example 7 | C-7 | 129.1 | 2.91E−3 |
| Comparative Example 8 | C-8 | 200.6 | 3.14E−3 |
| Comparative Example 9 | C-9 | 189.7 | 4.76E−2 |
| Comparative Example 10 | C-10 | 157.1 | 4.15E−2 |

In the photoelectric conversion elements of Examples 4 to 6 in which the junction length was 130 μm or more and less than 200 μm and the weight average molecular weight of the p-type semiconductor material was 40,000 or more and 200,000 or less, the values of dark current during application of −5 V were 1.66E−4 to 2.61E−4, which were significantly lower than those of the photoelectric conversion elements of Comparative Examples 6 to 10 in which one or both of the requirements were not satisfied.

Preparation Examples 7 to 10 and Comparative Preparation Example 11

Inks (I-7) to (I-10) and (C-11) were each prepared in the same manner as in Preparation Example 1 by using a mixed solvent of a first solvent and a second solvent in combination at a mixing ratio (% by weight) shown in Table 9, the polymer compound P-2 (1% by weight in the whole ink) that was a p-type semiconductor material, and the compound N-2' that was an n-type semiconductor material.

Examples 7 to 10 and Comparative Example 11

Each photoelectric conversion element was prepared in the same manner as in Example 1 described except for using the inks (I-7) to (I-10) and (C-11) in Examples 7 to 10 and Comparative Example 11, respectively, and evaluated in the same manner. The results are shown in Table 10.

TABLE 10

|  | Ink | Junction length (μm) | Dark current at −5 V (A/cm$^2$) |
|---|---|---|---|
| Example 7 | I-7 | 165.5 | 6.17E−4 |
| Example 8 | I-8 | 182.5 | 2.61E−4 |
| Example 9 | I-9 | 163.3 | 3.95E−4 |
| Example 10 | I-10 | 174.8 | 1.83E−4 |
| Comparative example 11 | C-11 | 106.3 | 1.12E−3 |

In the photoelectric conversion elements of Examples 7 to 10 in which the junction length was 130 μm or more and less than 200 μm and the weight average molecular weight of the p-type semiconductor material was 40,000 or more and 200,000 or less, the values of dark current during application of −5 V were 1.83E−4 to 6.17E−4, which were significantly lower than that of the photoelectric conversion element of Comparative Example 11 in which one or both of the requirements were not satisfied.

Preparation Examples 11 to 13 and Comparative Preparation Example 12

Inks (I-11) to (I-13) and (C-12) were each prepared in the same manner as in Preparation Example 1 by using a mixed solvent of a first solvent and a second solvent in combination at a mixing ratio (% by weight) shown in Table 11, the polymer compound P-3 (1% by weight in the whole ink) that was a p-type semiconductor material, and the compound N-1' that was an n-type semiconductor material.

TABLE 9

|  | Ink | First solvent | Second solvent | Mixing ratio (% by weight) | Molecular weight of p-type semiconductor material (Mw) | p/n ratio |
|---|---|---|---|---|---|---|
| Preparation example 7 | I-7 | pseudocumene | propiophenone | 95/5 | 144000 | 1/2 |
| Preparation example 8 | I-8 | o-dichlorobenzene | — | — | 144000 | 1/1 |
| Preparation example 9 | I-9 | chlorobenzene | — | — | 144000 | 1/1 |
| Preparation example 10 | I-10 | tetralin | — | — | 144000 | 1/1 |
| Comparative preparation example 11 | C-11 | chlorobenzene | — | — | 144000 | 1/3 |

TABLE 11

|  | Ink | First solvent | Second solvent | Mixing ratio (% by weight) | Molecular weight of p-type semiconductor material (Mw) | P/n ratio |
|---|---|---|---|---|---|---|
| Preparation example 11 | I-11 | tetralin | — | — | 45000 | 1/1.5 |
| Preparation example 12 | I-12 | o-xylene | acetophenone | 90/10 | 45000 | 1/1.5 |
| Preparation example 13 | I-13 | pseudocumene | propiophenone | 95/5 | 45000 | 1/1.5 |
| Comparative preparation example 12 | C-12 | o-dichlorobenzene | — | — | 45000 | 1/1.5 |

Examples 11 to 13 and Comparative Example 12

Each photoelectric conversion element was produced in the same manner as in Example 1 described except for using the inks (I-11) to (I-13) and (C-12) in Examples 11 to 13 and Comparative Example 12, respectively, and evaluated in the same manner. The results are shown in Table 12.

TABLE 12

|  | Ink | Junction length (μm) | Dark current at −5 V (A/cm$^2$) |
|---|---|---|---|
| Example 11 | I-11 | 141.8 | 6.11E−5 |
| Example 12 | I-12 | 140.5 | 1.49E−4 |
| Example 13 | I-13 | 138.0 | 2.71E−5 |
| Comparative example 12 | C-12 | 100.7 | 4.42E−2 |

In the photoelectric conversion elements of Examples 11 to 13 in which the junction length was 130 μm or more and less than 200 μm and the weight average molecular weight of the p-type semiconductor material was 40,000 or more and 200,000 or less, the values of dark current during application of −5 V were 2.71E−5 to 1.49E−4, which were significantly lower than that of the photoelectric conversion element of Comparative Example 12 in which one or both of the requirements were not satisfied.

Preparation Examples 14 to 16 and Comparative Preparation Examples 13 to 17

Inks (I-14) to (I-16) and (C-13) to (C-17) were each prepared in the same manner as in Preparation Example 1 described by using a mixed solvent of a first solvent and a second solvent in combination at a mixing ratio (% by weight) shown in Table 13, the polymer compound P-4 (1% by weight in the whole ink) that was a p-type semiconductor material, and the compound N-1' that was an n-type semiconductor material.

TABLE 13

|  | Ink | First solvent | Second solvent | Mixing ratio (% by weight) | Molecular weight of p-type semiconductor material (Mw) | p/n ratio |
|---|---|---|---|---|---|---|
| Preparation example 14 | I-14 | pseudocumene | propiophenone | 95/5 | 59400 | 1/1 |
| Preparation example 15 | I-15 | pseudocumene | benzylbenzoate | 95/5 | 59400 | 1/1 |
| Preparation example 16 | I-16 | tetralin | propiophenone | 90/10 | 59400 | 1/1 |
| Comparative preparation example 13 | C-13 | chlorobenzene | — | — | 59400 | 1/3 |
| Comparative preparation example 14 | C-14 | o-dichlorobenzene | — | — | 59400 | 1/1 |
| Comparative preparation example 15 | C-15 | tetralin | — | — | 59400 | 1/1 |
| Comparative preparation example 16 | C-16 | tetralin | — | — | 59400 | 1/1.5 |
| Comparative preparation example 17 | C-17 | pseudocumene | benzylbenzoate | 95/5 | 35700 | 1/1.5 |

Examples 14 to 16 and Comparative Examples 13 to 17

Each photoelectric conversion element was produced in the same manner as in Example 1 described except for using the inks (I-14) to (I-16) and (C-13) to (C-17) in Examples 14 to 16 and Comparative Examples 13 to 17, respectively, and evaluated in the same manner. The results are shown in Table 14.

TABLE 14

|  | Ink | Junction length (μm) | Dark current at −5 V (A/cm$^2$) |
|---|---|---|---|
| Example 14 | I-14 | 133.8 | 2.14E−5 |
| Example 15 | I-15 | 130.3 | 9.16E−6 |
| Example 16 | I-16 | 136.4 | 5.85E−5 |
| Comparative example 13 | C-13 | 93.6 | 1.59E−3 |
| Comparative example 14 | C-14 | 113.4 | 2.29E−3 |
| Comparative example 15 | C-15 | 116.1 | 1.00E−3 |
| Comparative example 16 | C-16 | 225.4 | 3.68E−3 |
| Comparative example 17 | C-17 | 148.3 | 5.52E−2 |

In the photoelectric conversion elements of Examples 14 to 16 in which the junction length was 130 μm or more and less than 200 μm and the weight average molecular weight of the p-type semiconductor material was 40,000 or more and 200,000 or less, the values of dark current during application of −5 V were 9.16E−6 to 5.85E−5, which were significantly lower than those of the photoelectric conversion elements of Comparative Examples 13 to 17 in which one or both of the requirements were not satisfied.

Preparation Example 17 and Comparative Preparation Examples 18 to 21

Inks (I-17) and (C-18) to (C-21) were each prepared in the same manner as in Preparation Example 1 by using a mixed solvent of a first solvent and a second solvent in combination at a mixing ratio (% by weight) shown in Table 15, the polymer compound P-5 (1% by weight in the whole ink) that was a p-type semiconductor material, and the compound N-2' that was an n-type semiconductor material.

TABLE 15

| | Ink | First solvent | Second solvent | Mixing ratio (% by weight) | Molecular weight of p-type semiconductor material (Mw) | p/n ratio |
|---|---|---|---|---|---|---|
| Preparation example 17 | I-17 | o-dichlorobenzene | — | — | 168000 | 1/1 |
| Comparative preparation example 18 | C-18 | pseudocumene | propiophenone | 95/5 | 218000 | 1/1 |
| Comparative preparation example 19 | C-19 | chlorobenzene | — | — | 168000 | 1/3 |
| Comparative preparation example 20 | C-20 | pseudocumene | propiophenone | 95/5 | 168000 | 1/1 |
| Comparative preparation example 21 | C-21 | pseudocumene | propiophenone | — | 36900 | 1/1.5 |

Example 17 and Comparative Examples 18 to 21

Each photoelectric conversion element was produced in the same manner as in Example 1 described except for using the inks (I-17) and (C-18) to (C-21) in Example 17 and Comparative Examples 18 to 21, respectively, and evaluated in the same manner. The results are shown in Table 16.

TABLE 16

| | Ink | Junction length (μm) | Dark current at −5 V (A/cm$^2$) |
|---|---|---|---|
| Example 17 | I-17 | 150.3 | 5.58E−4 |
| Comparative Example 18 | C-18 | 142.4 | 1.36E−2 |
| Comparative example 19 | C-19 | 100.6 | 3.96E−2 |
| Comparative example 20 | C-20 | 208.6 | 2.37E−3 |
| Comparative example 21 | C-21 | 157.9 | 7.29E−2 |

In the photoelectric conversion element of Example 17 in which the junction length was 130 μm or more and less than 200 μm and the weight average molecular weight of the p-type semiconductor material was 40,000 or more and 200,000 or less, the value of dark current during application of −5 V was significantly lower than those of the photoelectric conversion elements of Comparative Examples 18 to 21 in which one or both of the requirements were not satisfied.

Preparation Examples 18 and 20 and Comparative Preparation Example 22

Inks (I-18) to (I-20) and (C-22) were each prepared in the same manner as in Preparation Example 1 described by using a mixed solvent of a first solvent and a second solvent in combination at a mixing ratio (% by weight) shown in Table 17, the polymer compound P-6 (1% by weight in the whole ink) that was a p-type semiconductor material, and the compound N-2' that was an n-type semiconductor material.

TABLE 17

| | Ink | First solvent | Second solvent | Mixing ratio (% by weight) | Molecular weight of p-type semiconductor material (Mw) | p/n ratio |
|---|---|---|---|---|---|---|
| Preparation example 18 | I-18 | pseudocumene | benzylbenzoate | 90/10 | 59800 | 1/2 |
| Preparation example 19 | I-19 | tetralin | — | — | 59800 | 1/2 |
| Preparation example 20 | I-20 | pseudocumene | propiophenone | 90/10 | 59800 | 1/2 |
| Comparative preparation example 22 | C-22 | o-dichlorobenzene | — | — | 59800 | 1/2 |

Examples 18 to 20 and Comparative Example 22

Each photoelectric conversion element was produced in the same manner as in Example 1 described except for using the inks (I-18) and (I-20) and (C-22) in Examples 18 to 20 and Comparative Example 22, respectively, and evaluated in the same manner. The results are shown in Table 18.

TABLE 18

|  | Ink | Junction length (μm) | Dark current at −5 V (A/cm$^2$) |
|---|---|---|---|
| Example 18 | I-18 | 148.1 | 3.29E−4 |
| Example 19 | I-19 | 136.2 | 1.09E−4 |
| Example 20 | I-20 | 135.2 | 6.50E−4 |
| Comparative example 22 | C-22 | 127.3 | 4.42E−2 |

In the photoelectric conversion elements of Examples 18 to 20 in which the junction length was 130 μm or more and less than 200 μm and the weight average molecular weight of the p-type semiconductor material was 40,000 or more and 200,000 or less, the values of dark current during application of −5 V were 1.09E-4 to 6.50E-4, which were significantly lower than that of the photoelectric conversion element of Comparative Example 22 in which one or both of the requirements were not satisfied.

EXPLANATIONS OF LETTERS OR NUMERALS

1 Image detection portion
2 Display device
10 Photoelectric conversion element
11, 210 Supporting substrate
12 Anode
13 Hole transport layer
14 Active layer
15 Electron transport layer
16 Cathode
17, 240 Sealing substrate
20 CMOS transistor substrate
30 Interlayer insulating layer
32 Interlayer wiring portion
40 Sealing layer
50 Color filter
100 Fingerprint detection portion
200 Display panel portion
200a Display region
220 Organic EL element
230 Touch sensor panel

The invention claimed is:

1. A photodetector comprising:
   an anode;
   a cathode; and
   an active layer provided between the anode and the cathode, wherein the active layer contains a p-type semiconductor material that is a polymer compound having a polystyrene-equivalent weight average molecular weight of 40,000 or more and 200,000 or less, and an n-type semiconductor material, and
   on an image obtained by binarizing an image of the active layer observed by a transmission electron microscope, a junction length between a phase of the p-type semiconductor material and a phase of the n-type semiconductor material is 130 μm or more and less than 200 μm per square micrometer of area of the binarized image.

2. The photodetector according to claim 1, wherein the n-type semiconductor material is a fullerene derivative.

3. The photodetector according to claim 1, wherein the p-type semiconductor material is a polymer compound having a constitutional unit containing a thiophene skeleton.

4. An image sensor comprising the photodetector according to claim 1.

5. A fingerprint authentication device comprising the photodetector according to claim 1.

6. A method for producing a photodetector comprising an anode, a cathode, and an active layer provided between the anode and the cathode, comprising:
   forming the active layer comprising a step (i) of applying an ink containing a p-type semiconductor material that is a polymer compound having a polystyrene-equivalent weight average molecular weight of 40,000 or more and 200,000 or less, an n-type semiconductor material, and a solvent to an object to be applied, to obtain a coating film, and a step (ii) of removing the solvent from the coating film, wherein
   on an image obtained by binarizing an image of the active layer observed by a transmission electron microscope, a junction length between the n-type semiconductor material and the p-type semiconductor material is 130 μm or more and less than 200 μm per square micrometer of area of the binarized image.

7. The method for producing a photodetector according to claim 6, wherein the n-type semiconductor material is a fullerene derivative.

8. The method for producing a photodetector according to claim 6, wherein the p-type semiconductor material is a polymer compound having a constitutional unit containing a thiophene skeleton.

* * * * *